(12) United States Patent
Matsushita et al.

(10) Patent No.: US 7,317,904 B2
(45) Date of Patent: Jan. 8, 2008

(54) DC OFFSET CANCEL CIRCUIT

(75) Inventors: Masatoshi Matsushita, Kanagawa (JP); Tomio Aida, Tokyo (JP); Yasutaka Uramoto, Kanagawa (JP)

(73) Assignee: Matshushita Electric Industrial Co., Ltd., Osaka (JP)

( * ) Notice: Subject to any disclaimer, the term of this patent is extended or adjusted under 35 U.S.C. 154(b) by 503 days.

(21) Appl. No.: 11/019,033

(22) Filed: Dec. 22, 2004

(65) Prior Publication Data
US 2005/0143032 A1 Jun. 30, 2005

(30) Foreign Application Priority Data
Dec. 25, 2003 (JP) .......................... P. 2003-428958
Mar. 11, 2004 (JP) .......................... P. 2004-068532
Sep. 14, 2004 (JP) .......................... P. 2004-266871

(51) Int. Cl.
*H04B 7/00* (2006.01)
(52) U.S. Cl. ..................... 455/232.1; 455/296; 375/346
(58) Field of Classification Search ..................... None
See application file for complete search history.

(56) References Cited
U.S. PATENT DOCUMENTS
6,459,889 B1 * 10/2002 Ruelke ....................... 455/296

2003/0086622 A1 * 5/2003 Klein Gunnewiek et al. .... 382/240

FOREIGN PATENT DOCUMENTS
JP 9-274539 10/1997
JP 9-331257 12/1997

* cited by examiner

*Primary Examiner*—Thanh Cong Le
(74) *Attorney, Agent, or Firm*—McDermott Will & Emery LLP

(57) ABSTRACT

A DC offset cancel circuit includes an analog adder 1 to whose one input a baseband analog signal output from a high-frequency reception section is input and to whose other input an analog correction signal output from a D/A converter 7 is input, and which corrects the reference voltage value of the baseband analog signal analogically to cancel a DC offset, an adder 3 which has the output of the A/D converter 2 as its one input and subtracts the lower bits of a sample value stored in a memory 6 to be described later as a DC offset value from the input value and outputs the resultant value, a control circuit 5 which outputs an output digital value of the A/D converter 2 as a sample value to the memory 6, and a D/A converter 7 which converts a digital value of the upper bits of a sample value stored in the memory 6 to an analog correction signal and outputs the analog correction signal to the analog adder 1.

31 Claims, 16 Drawing Sheets

100 : DC OFFSET CANCEL CIRCUIT

100 : DC OFFSET CANCEL CIRCUIT

| DIGITAL VALUE (DECIMAL) | ANALOG VALUE |
|---|---|
| +3 | −0.48V |
| +2 | −0.32V |
| +1 | −0.16V |
| 0 | 0V |
| −1 | +0.16V |
| −2 | +0.32V |
| −3 | +0.48V |

400 : DC OFFSET CANCEL CIRCUIT

500 : DC OFFSET CANCEL CIRCUIT

600 : DC OFFSET CANCEL CIRCUIT

WHEN DC OFFSET IS 0

WHEN DC OFFSET OF +0.6V IS SUPERIMPOSED

WHEN DC OFFSET OF -0.6V IS SUPERIMPOSED

800 : DC OFFSET CANCEL CIRCUIT

900 : DC OFFSET CANCEL CIRCUIT

1000 : DC OFFSET CANCEL CIRCUIT

1100 : DC OFFSET CANCEL CIRCUIT

1200 : DC OFFSET CANCEL CIRCUIT

1300 : DC OFFSET CANCEL CIRCUIT

1400 : DC OFFSET CANCEL CIRCUIT

1500 : DC OFFSET CANCEL CIRCUIT

DC OFFSET CANCEL CIRCUIT

BACKGROUND OF THE INVENTION

1. Field of the Invention

The present invention relates to a direct-current (DC) offset cancel circuit which is used in a demodulation circuit in a receiver in a radio communication system, such as a portable telephone, and cancels a DC component to be superimposed on a digital signal when a baseband analog signal output from a high-frequency reception section of the receiver is converted to a digital signal to be input to a demodulating section.

2. Description of the Related Art

The high-frequency reception section of the radio communication system, such as a portable telephone, converts a signal intermittently received for battery saving to a baseband analog signal, and outputs the baseband analog signal. The baseband analog signal is converted in an analog/digital (A/D) converter to a digital signal, which is in turn input to the demodulating section. The demodulating section performs error correction and takes bit synchronization and frame synchronization to execute a demodulating process.

In such a radio communication system, while the antenna input signal intermittently received undergoes frequency selection and amplification and frequency conversion in the high-frequency reception section to become a baseband analog signal, a DC component may be superimposed on the signal by analog elements or the like. If the baseband analog signal with the DC component superimposed thereon is converted to a digital signal as it is and the digital signal is then subjected to a demodulating process, the demodulating section may make a determination error depending on the threshold that is used to detect various kinds of signals. In this respect, a DC offset cancel circuit, which cancels a DC component at the circuit portion that converts the baseband analog signal to a digital signal, is used.

FIG. 5 is a block diagram showing a conventional DC offset cancel circuit 500. The DC offset cancel circuit 500 includes an A/D converter 51 which converts a baseband analog signal output from a high-frequency reception section to a digital signal, an averaging circuit 52 which acquires an average value of digital signals sequentially output from the A/D converter 51, an adder 53 which adds the digital signal output from the A/D converter to a predetermined offset value to cancel out a DC component, a determination section 55 which outputs the digital signal output from the adder 53 to a demodulating section, determines whether the digital signal is originated from a significant signal or noise, and outputs the result as significant signal/noise determination information, a control section 56 which activates the averaging circuit 52 in a zone for which the input signal is judged to be noise from the significant signal/noise determination information output from the determination section 55, writes acquired offset values on a memory 54 to be described later one by one, and stops the averaging circuit 52 in a zone for which the input signal is decided to be a significant signal and outputs the offset value stored in the memory 54 to the adder 53, and the memory 54 which writes the offset values acquired by the averaging circuit 52 one after another in response to an instruction from the control section 56.

The DC offset cancel circuit 500 is designed in such a way that the A/D converter 51 converts the baseband analog signal output from the high-frequency reception section to a digital signal to be one input of the adder 53, the averaging circuit 52 acquires the average value of the DC component of the digital signal, the control section 56 stores the average value of the DC component in the noise zone in the memory 54 according to information of the noise zone and the significant zone in the intermittent reception, acquired by the determination section 55, and the stored value is input to the other end of the adder 53 for subtraction in the significant zone (see, for example, Japanese Patent Laid-Open Publication No. H9-274539 (FIG. 2)).

FIG. 6 is a block diagram showing another conventional DC offset cancel circuit 600. The DC offset cancel circuit 600 includes a buffer 61 which receives a baseband analog signal output from a high-frequency reception section, an amplifier 52 which amplifies the output signal of the buffer 61, an A/D converter 63 which converts an analog signal output from the amplifier 62 to a digital signal, a level detector 64 which detects the output amplitude level of the A/D converter 53, an adder 65 which adds the digital signal output from the A/D converter 63 and a predetermined offset value to cancel a DC offset, a determination section 66 which outputs the digital signal output from the adder 65 to a demodulating section, determines whether the digital signal is a significant signal or noise and outputs significant signal/noise determination information, an averaging circuit 67 which computes an average value of the digital signal output from the A/D converter 63, a control section 68 which activates the averaging circuit 67 when the input signal is judged to be noise and outputs the acquired value as an offset value to a memory 69 to be described later, and stops the averaging circuit 67 when the input signal is judged to be a significant signal and outputs the offset value stored in the memory 69 to the adder 65, the memory 69 which stores the offset values acquired by the averaging circuit 67 in response to an instruction from the control section 68, a reference value register 70 in which a reference voltage value for the input signal is set and stored as a digital value beforehand, an adder 71 which adds the offset value read from the memory 69 in response to an instruction from the control section 68 to the value registered in the reference value register 70 and outputs a resultant value, and a D/A converter 72 which converts a digital value output from the adder 71 to an analog value and outputs the analog value to the buffer 61 as a DC-component removed reference voltage value.

In the DC offset cancel circuit 600, the baseband analog signal output from the high-frequency reception section is input to one input terminal of the buffer 61, is amplified by the amplifier 62, and is converted in the A/D converter 63 to a digital signal to be an input of one input terminal of the adder 65. The level detector 64 monitors the level of the digital value, and the averaging circuit 67 acquires the average value of the digital value. The control section 68 stores the average value of the DC component of noise in the memory 69 according to information on the noise or significant zone acquired by the determination section 66 and information from the level detector 64. In the significant zone, when the detected level is low, the stored value in the memory 69 is input to the subtraction terminal of the adder 65 to cancel out the DC offset, and when the detected level is high, the stored value in the memory 69 is given to the adder 71 to be added to the reference value, and the resultant value is converted in the D/A converter 72 to an analog value to be input to the other end of the buffer 61, thereby correcting a DC fluctuating component (see, for example, Japanese Patent Laid-Open Publication No. H9-331257 (FIG. 3)).

SUMMARY OF THE INVENTION

As the DC offset cancel circuit 500 in Patent Literature 1 shown in FIG. 5 is constructed to cancel an offset value at the digital circuit of the averaging circuit 52, the memory 54 and the adder 53 after A/D conversion, the signal level of the baseband analog signal input to the A/D converter 51 is shifted by the DC offset, so that the minimum value or the maximum value of the signal level is increased, the A/D converter 51 should have a high-input dynamic range greater than is originally needed for A/D conversion of the amplitude level of the baseband analog signal. When the DC offset is large, therefore, it is difficult to achieve cancellation of the offset value, and the circuit scale becomes larger, which makes it difficult to achieve low power consumption.

To improve the shortcoming that arises from cancellation of an offset value with a digital circuit alone, the DC offset cancel circuit 600 in Patent Literature 2 shown in FIG. 6 uses both the buffer 61 at the input section and the D/A converter 72 which outputs a reference voltage value to the buffer 61 to analogically cancel the DC offset of the baseband analog signal to be input to the A/D converter 63.

However, the operation is carried out as the cancel operation by the digital circuit is switched to analogic cancellation and the DC offset is substantially canceled by the analog circuit alone when the determination section 66 detects a significant zone and the level detector 64 decides that the amplitude of a significant signal is sufficiently large. Therefore, accomplishing cancellation of a DC offset at a high precision requires that the D/A converter 72, which is one constituting component, should have high bits and high resolution. This makes it harder to achieve cancellation of an offset value and enlarges the circuit scale, so that low power consumption is difficult to achieve.

Next, the problems of the prior art will be described using specific numerals. FIG. 7 shows a baseband analog signal output from the high-frequency reception section, FIG. 7(A) shows a case where the DC offset is 0, FIG. 7(B) shows a case where a DC offset of +0.6V is superimposed, and FIG. 7(C) shows a case where a DC offset of −0.6V is superimposed.

As shown in FIGS. 7(A) to 7(C), the baseband analog signal output from the high-frequency reception section has the maximum amplitude value of 1.4 Vpp and an analog ground voltage of 1.4V, and a maximum of a DC offset which is +0.6V is superimposed. A/D conversion has a resolution of 12 bits and the demanded accuracy of cancellation of a DC offset is likewise 12 bits.

The minimum supply voltage is 2.7V.

When digital offset cancel is digitally carried out only with the digital circuit at the subsequent stage of the A/D converter 51 as performed in the prior art disclosed in Patent Literature 1 as shown in FIG. 5, the cancel accuracy which can be achieved for the A/D converter 51 has a 12-bit resolution. However, the maximum value and the minimum value of the input signal respectively become 2.1V and 0.7V when a DC offset is 0 as shown in FIG. 7(A), whereas the maximum value of the input signal becomes 2.7V when a DC offset of +0.6V is superimposed as shown in FIG. 7(B) and the minimum value of the input signal becomes 0.1V when a DC offset of −0.6V is superimposed as shown in FIG. 7(C). Therefore, the input dynamic range of the A/D converter 51 requires 2.6V from 0.1V to 2.7V, which makes it difficult to easily achieve the minimum supply voltage in the specification of 2.7V.

When analog offset cancel is carried out by storing the output of the averaging circuit 67 in the memory 69 and performing D/A conversion of the output value using the D/A converter 72 as performed in the prior art disclosed in Patent Literature 2 as shown in FIG. 6, the DC offset of the signal input to the A/D converter 63 is canceled. Therefore, the range between the maximum value and the minimum value when the DC offset is 0 as shown in FIG. 7(A), i.e., 1.4V from 0.7V to 2.1V is sufficient for the input dynamic range of the A/D converter 63, which is easily achieved. To achieve the cancel accuracy of 12 bits, however, the D/A converter 72 is demanded to have a high resolution of 12 bits, which is very hard to achieve and needs a large circuit scale and high power consumption.

SUMMARY OF THE INVENTION

The present invention has been made in view of the conventional circumstances, and aims at providing a DC offset cancel circuit which easily achieves high-precision cancellation of a DC offset, when required, by lowering the specifications required for A/D converter and a D/A converter, and which ensures a smaller circuit scale and lower power consumption.

A DC offset cancel circuit according to the first aspect of the invention includes an analog adder which subtracts, from a baseband analog signal input to one end, an analog correction signal input from the other end; an A/D converter which converts an output of the analog adder to a digital value; a control circuit which extracts an output digital value of the A/D converter as a sample value; a control section which controls an operation timing of the control circuit; a memory which stores the sample value; a D/A converter which converts upper bits of the sample value to an analog value and outputs the analog value as the analog correction signal to the analog adder; and an adder which subtracts, from an output of the A/D converter input to one end, lower bits of the sample value input from the other end.

A DC offset cancel circuit according to the second aspect of the invention includes an analog adder which subtracts, from a baseband analog signal input to one end, an analog correction signal input from the other end; an A/D converter which converts an output of the analog adder to a digital value; an averaging circuit which acquires an average value of an output digital value of the A/D converter; a control section which controls an operation timing of the averaging circuit; a memory which stores the average value; a D/A converter which converts upper bits of the average value to an analog value and outputs the analog value as the analog correction signal to the analog adder; and an adder which subtracts, from an output of the A/D converter input to one end, lower bits of the average value input from the other end.

A DC offset cancel circuit according to the third aspect of the invention includes an analog adder which subtracts, from a baseband analog signal input to one end, an analog correction signal input from the other end; an A/D converter which converts an output of the analog adder to a digital value; an averaging circuit which acquires an average value of an output digital value of the A/D converter; a control section which controls an operation timing of the averaging circuit; a memory which stores the average value; a D/A converter which converts upper bits of the average value to an analog value and outputs the analog value as the analog correction signal to the analog adder; an adder which subtracts, from an output of the A/D converter input to one end, lower bits of the average value input from the other end; and a determination section which performs timing control of the control section in a noise zone determined from an output signal of the adder.

A DC offset cancel circuit according to the fourth aspect of the invention includes an analog adder which subtracts, from a baseband analog signal input to one end, an analog correction signal input from the other end; an A/D converter which converts an output of the analog adder to a digital value; an averaging circuit which acquires an average value of an output digital value of the A/D converter; a control section which controls an operation timing of the averaging circuit; a memory which stores the average value; a D/A converter which converts upper bits of the average value to an analog value and outputs the analog value as the analog correction signal to the analog adder; an adder which subtracts, from an output of the A/D converter input to one end, lower bits of the average value input from the other end; and a determination section which performs timing control of the control section in a noise zone determined from an output signal of the A/D converter.

A DC offset cancel circuit according to the fifth aspect of the invention includes an analog adder which subtracts, from a baseband analog signal input to one end, an analog correction signal input from the other end; an A/D converter which converts an output of the analog adder to a digital value; an averaging circuit which acquires an average value of an output digital value of the A/D converter; a control section which controls an operation timing of the averaging circuit; a memory which stores the average value; a D/A converter which converts upper bits of the average value to an analog value and outputs the analog value as the analog correction signal to the analog adder; an adder which subtracts, from an output of the A/D converter input to one end, lower bits of the average value input from the other end; and a determination section which performs timing control of the control section in a noise zone determined from an output signal of the analog adder.

A DC offset cancel circuit according to the sixth aspect of the invention includes an analog adder which subtracts, from a baseband analog signal input to one end, an analog correction signal input from the other end; an A/D converter which converts an output of the analog adder to a digital value; an averaging circuit which acquires an average value of an output digital value of the A/D converter; a control section which controls an operation timing of the averaging circuit; a memory which stores the average value; a D/A converter which converts upper bits of the average value to an analog value and outputs the analog value as the analog correction signal to the analog adder; an adder which subtracts, from an output of the A/D converter input to one end, lower bits of the average value input from the other end; and a determination section which performs timing control of the control section in a noise zone determined from the baseband analog signal.

A DC offset cancel circuit according to the seventh aspect of the invention includes an analog adder which subtracts, from a baseband analog signal input to one end, an analog correction signal input from the other end;

an A/D converter which converts an output of the analog adder to a digital value; a control circuit which extracts an output digital value of the A/D converter as a sample value; a control section which controls an operation timing of the control circuit; a memory which stores the sample value; a D/A converter which converts upper bits of the sample value to an analog value and outputs the analog value as the analog correction signal to the analog adder; an adder which subtracts, from an output of the A/D converter input to one end, lower bits of the sample value input from the other end; and a determination section which performs timing control of the control section in a noise zone determined from an output signal of the adder.

A DC offset cancel circuit according to the eighth aspect of the invention includes an analog adder which subtracts, from a baseband analog signal input to one end, an analog correction signal input from the other end; an A/D converter which converts an output of the analog adder to a digital value; a control circuit which extracts an output digital value of the A/D converter as a sample value; a control section which controls an operation timing of the control circuit; a memory which stores the sample value; a D/A converter which converts upper bits of the sample value to an analog value and outputs the analog value as the analog correction signal to the analog adder; an adder which subtracts, from an output of the A/D converter input to one end, lower bits of the sample value input from the other end; and a determination section which performs timing control of the control section in a noise zone determined from an output signal of the A/D converter.

A DC offset cancel circuit according to the ninth aspect of the invention includes an analog adder which subtracts, from a baseband analog signal input to one end, an analog correction signal input from the other end; an A/D converter which converts an output of the analog adder to a digital value; a control circuit which extracts an output digital value of the A/D converter as a sample value; a control section which controls an operation timing of the control circuit; a memory which stores the sample value; a D/A converter which converts upper bits of the sample value to an analog value and outputs the analog value as the analog correction signal to the analog adder; an adder which subtracts, from an output of the A/D converter input to one end, lower bits of the sample value input from the other end; and a determination section which performs timing control of the control section in a noise zone determined from an output signal of the analog adder.

A DC offset cancel circuit according to the tenth aspect of the invention includes an analog adder which subtracts, from a baseband analog signal input to one end, an analog correction signal input from the other end; an A/D converter which converts an output of the analog adder to a digital value; a control circuit which extracts an output digital value of the A/D converter as a sample value; a control section which controls an operation timing of the control circuit; a memory which stores the sample value; a D/A converter which converts upper bits of the sample value to an analog value and outputs the analog value as the analog correction signal to the analog adder; an adder which subtracts, from an output of the A/D converter input to one end, lower bits of the sample value input from the other end; and a determination section which performs timing control of the control section in a noise zone determined from the baseband analog signal.

In the case where the A/D converter in the DC offset cancel circuits according to the first to tenth aspects of the invention is an A/D converter that includes internally an analog adder and a D/A converter, which outputs a feedback analog signal for A/D conversion to the analog adder, as typified by a delta-sigma modulation type A/D converter, the analog adder shares a function of subtracting, from an analog signal input to one end, an analog correction signal input from the other end, similar to the function of the analog adder in the DC offset cancel circuits according to the first to tenth aspects of the invention, and a function of adding or subtracting the feedback analog signal for A/D conversion, and the D/A converter has a function of adding, at the input section of the D/A converter or at the output section of the D/A converter, a function of performing D/A conversion of the upper bits of a value stored in the memory which is a sample value extracted by the control circuit or an average value computed by the averaging circuit in the DC offset cancel circuits according to the first to tenth aspects of the invention, a function of performing D/A conversion of the feedback analog signal for normal A/D conversion.

The A/D converter in the DC offset cancel circuits according to the first to tenth aspects of the invention indicates all A/D conversion systems and includes an ordinary Nyquist rate A/D converter, an oversampling A/D converter as typified by a delta-sigma modulation type A/D converter, and the function of a digital filter which is used only for band limitation at the subsequent stage of the A/D converter or used both for band limitation and lowering the sampling rate.

Accordingly, a DC offset cancel circuit according to the eleventh aspect of the invention includes a share analog adder which subtracts, from a baseband analog signal input to one end, an analog correction signal input from the other end; an integrator which integrates an output of the share analog adder; a quantizer which quantizes an output of the integrator; an averaging circuit which acquires an average value of an output digital value of the quantizer; a control section which controls an operation timing of the control circuit; a memory which stores the sample value; a share D/A converter which is supplied with a feedback signal based on an output of the quantizer, converts upper bits of the sample value to an analog value and outputs the analog value as the analog correction signal to the share analog adder; and an adder which subtracts, from an output of the quantizer input to one end, lower bits of the sample value input from the other end.

A DC offset cancel circuit according to the twelfth aspect of the invention includes a share analog adder which subtracts, from a baseband analog signal input to one end, an analog correction signal input from the other end; an integrator which integrates an output of the share analog adder; a quantizer which quantizes an output of the integrator; a control circuit which extracts an output digital value of the quantizer as a sample value; a control section which controls an operation timing of the control circuit; a memory which stores the sample value; a share D/A converter which is supplied with a feedback signal based on an output of the quantizer, converts upper bits of the sample value to an analog value and outputs the analog value as the analog correction signal to the share analog adder; an adder which subtracts, from an output of the quantizer input to one end, lower bits of the sample value input from the other end; and a decimation digital filter connected between the output of the quantizer and the input of the adder.

A DC offset cancel circuit according to the thirteenth aspect of the invention includes a share analog adder which subtracts, from a baseband analog signal input to one end, an analog correction signal input from the other end; an integrator which integrates an output of the share analog adder; an analog adder which subtracts a predetermined analog value from an output of the integrator; an integrator which integrates an output of the analog adder; a quantizer which quantizes an output of the integrator; a feedback D/A converter which converts a feedback signal based on an output of the quantizer to the analog value and outputs the analog value to the analog adder; an averaging circuit which acquires an average value of an output digital value of the quantizer; a control section which controls an operation timing of the control circuit; a memory which stores the sample value; a share D/A converter which is supplied with a feedback signal based on an output of the quantizer, converts upper bits of the sample value to an analog value and outputs the analog value as the analog correction signal to the share analog adder; and an adder which subtracts, from an output of the quantizer input to one end, lower bits of the sample value input from the other end.

A DC offset cancel circuit according to the fourteenth aspect of the invention includes an analog adder which subtracts, from a baseband analog signal input to one end, a predetermined analog value input from the other end; an integrator which integrates an output of the analog adder; a share analog adder which subtracts an analog correction signal from an output of the integrator; an integrator which integrates an output of the share analog adder; a quantizer which quantizes an output of the integrator; a feedback D/A converter which converts a feedback signal based on an output of the quantizer to the analog value and outputs the analog value to the analog adder; an averaging circuit which acquires an average value of an output digital value of the quantizer; a control section which controls an operation timing of the control circuit; a memory which stores the sample value; a correction section which performs an arithmetic processing on a digital value of upper bits of the sample value; a share D/A converter which is supplied with a feedback signal based on an output of the quantizer, converts an output of the correction section to an analog value and outputs the analog value as the analog correction signal to the share analog adder; and an adder which subtracts, from an output of the quantizer input to one end, lower bits of the sample value input from the other end.

A DC offset cancel circuit according to the fifteenth aspect of the invention includes a share analog adder which subtracts, from a baseband analog signal input to one end, an analog correction signal input from the other end; an integrator which integrates an output of the share analog adder; a share analog adder which subtracts an analog correction signal from an output of the integrator; an integrator which integrates an output of the share analog adder; a quantizer which quantizes an output of the integrator; an averaging circuit which acquires an average value of an output digital value of the quantizer; a control section which controls an operation timing of the control circuit; a memory which stores the sample value; a dividing section which divides upper bits of the sample value to first and second upper bits; a correction section which performs an arithmetic processing on the second upper bits output from the dividing section; a share D/A converter which is supplied with a feedback signal based on an output of the quantizer, converts the first upper bits output from the dividing section to an analog value and outputs the analog value as the analog correction signal to the share analog adder; a share D/A converter which is supplied with a feedback signal based on an output of the quantizer, converts an output of the correction section to an analog value and outputs the analog value as the analog correction signal to the share analog adder; and an adder which subtracts, from an output of the quantizer input to one end, lower bits of the sample value input from the other end.

According to the above-described structures, as the upper bits of a value stored in the memory which is a sample value extracted by the control circuit or an average value computed by the averaging circuit is supplied to the analog adder at the input section by using the D/A converter and the reference voltage of the analog baseband signal in an analogic mode, it is possible to correct the DC offset of the signal level input to the A/D converter at the subsequent stage of the analog adder to thereby prevent the minimum value and the maximum value from increasing and reduce the required specification of the input dynamic range. As the lower bits of a value in the memory are subtracted digitally to cancel a DC offset by the adder which is a digital circuit, arithmetic processings with a high accuracy can be carried out, making it possible to reduce the required specification of the resolution of the D/A converter assigned to upper bits.

In the case where the A/D converter is an A/D converter that includes an analog adder and a D/A converter, which outputs a feedback analog signal for A/D conversion to the analog adder, as typified by a delta-sigma modulation type A/D converter, the analog adder shares a function of subtracting, from an analog signal input to one end, an analog correction signal input from the other end, similar to the function of the analog adder in the DC offset cancel circuits according to the first to tenth aspects of the invention, and a function of adding or subtracting the feedback analog signal for A/D conversion, and the D/A converter has a function of adding, at the input section of the D/A converter or at the output section of the D/A converter, a function of performing D/A conversion of the upper bits of a value stored in the memory which is a sample value extracted by the control circuit or an average value computed by the averaging circuit in the DC offset cancel circuits according to the first to tenth aspects of the invention, a function of performing D/A conversion of the feedback analog signal for normal A/D conversion. This structure eliminates the need for the analog adder at the preceding stage of the A/D converter, making it possible to reduce the required specification of the dynamic range of an analog circuit, such as an integrator at the subsequent stage of the analog adder in the A/D converter.

According to the present invention, as the upper bits of a value stored in the memory which is a sample value extracted by the control circuit or an average value computed by the averaging circuit is supplied to the analog adder at the input section by using the D/A converter and the reference voltage of the analog baseband signal is corrected in an analogic mode, it is possible to correct the DC offset of the signal level input to the A/D converter at the subsequent stage of the analog adder to thereby prevent the minimum value and the maximum value from increasing and reduce the required specification of the input dynamic range.

As the lower bits of a value in the memory are subtracted digitally to cancel a DC offset by the adder which is a digital circuit, arithmetic processings with a high accuracy can be carried out, making it possible to reduce the required specification of the resolution of the D/A converter assigned to upper bits. Further, even when the DC offset is large and a high-precision DC offset cancel should be achieved, it is easily achieved and the circuit scale and power consumption can be reduced.

In the case where the A/D converter is an A/D converter that includes an analog adder and a D/A converter, which outputs a feedback analog signal for A/D conversion to the analog adder, as typified by a delta-sigma modulation type A/D converter, the analog adder shares a function of subtracting, from an analog signal input to one end, an analog correction signal input from the other end, similar to the function of the analog adder in the DC offset cancel circuits according to the first to tenth aspects of the invention, and a function of adding or subtracting the feedback analog signal for A/D conversion, and the D/A converter has a function of adding, at the input section of the D/A converter or at the output section of the D/A converter, a function of performing D/A conversion of the upper bits of a value stored in the memory which is a sample value extracted by the control circuit or an average value computed by the averaging circuit in the DC offset cancel circuits according to the first to tenth aspects of the invention, a function of performing D/A conversion of the feedback analog signal for normal A/D conversion. This structure eliminates the need for the analog adder at the preceding stage of the A/D converter, making it possible to reduce the required specification of the dynamic range of an analog circuit, such as an integrator at the subsequent stage of the analog adder in the A/D converter.

DESCRIPTION OF THE PREFERRED EMBODIMENTS

Figure 1:
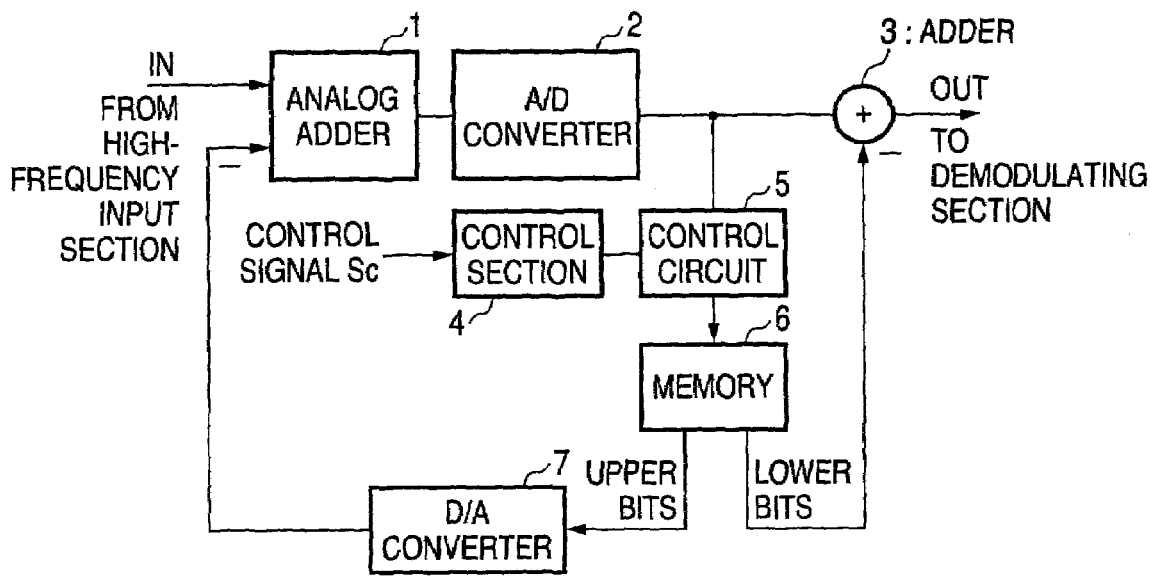
FIG. 1 is a block diagram showing the schematic structure of a DC offset cancel circuit according to the first embodiment of the invention.

FIG. 1 is a block diagram showing the schematic structure of a DC offset cancel circuit according to the first embodiment of the invention. A DC offset cancel circuit 100 includes an analog adder 1 having one input to which a baseband analog signal output from a high-frequency reception section is input and another input to which an analog correction signal output from a D/A converter 7 to be described later is input, and corrects a reference voltage value of the baseband analog signal to cancel a DC offset analogically, an A/D converter 2 which converts an analog signal output from the analog adder 1 to a digital signal, an adder 3 which subtracts lower bits of a sample value stored in a memory 6 to be described later, as a DC offset value, from an output from the A/D converter 2 as one input, a control circuit 5 which outputs an output digital value of the A/D converter 2 as a sample value to the memory 6 when given an operational instruction, a control section 4 which gives an operational instruction to the control circuit 5 in response to a control signal Sc, the memory 6 which stores a sample value extracted by the control circuit 5, and the D/A converter 7 which converts the digital value of the upper bits of a sample value stored in the memory 6 to an analog correction signal, and outputs the analog correction signal to the analog adder 1.

Figures 3, 4:
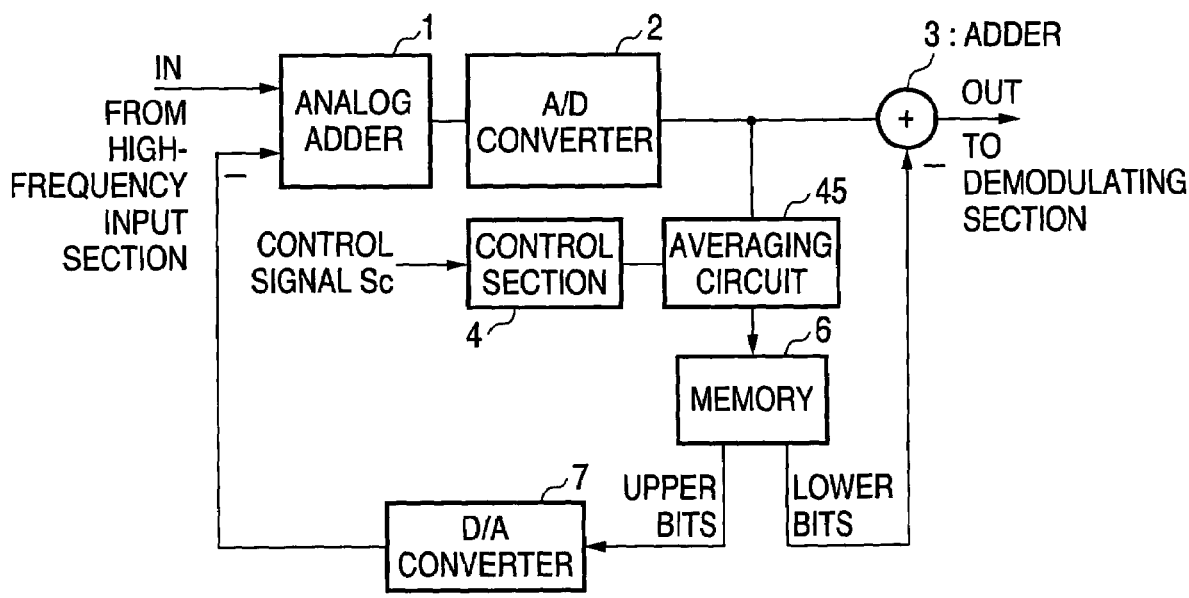
FIG. 3 is a conversion correlation table of a D/A converter in the DC offset cancel circuit.
FIG. 4 is a block diagram showing the schematic structure of a DC offset cancel circuit according to the second embodiment of the invention.
Figure 5:
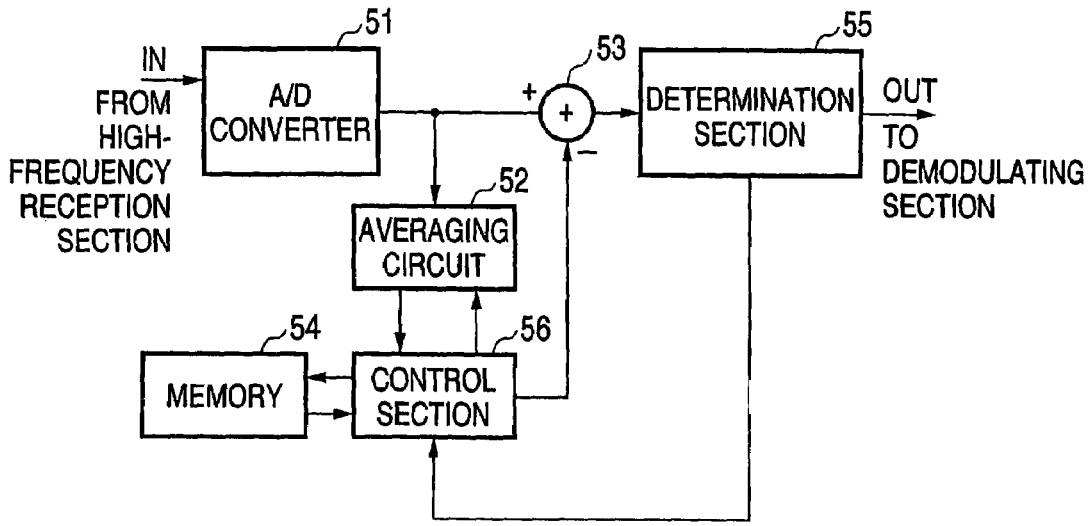
FIG. 5 is a block diagram showing a conventional DC offset cancel circuit.
Figure 6:
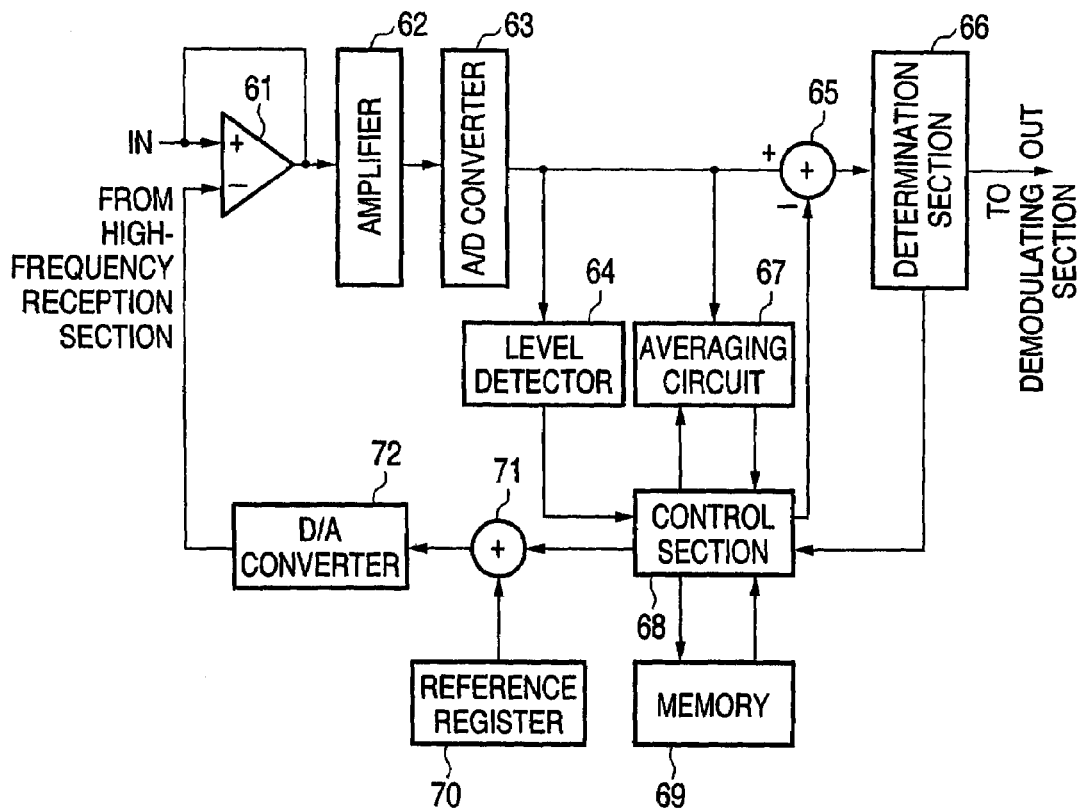
FIG. 6 is a block diagram showing a conventional DC offset cancel circuit.
Figure 7A:
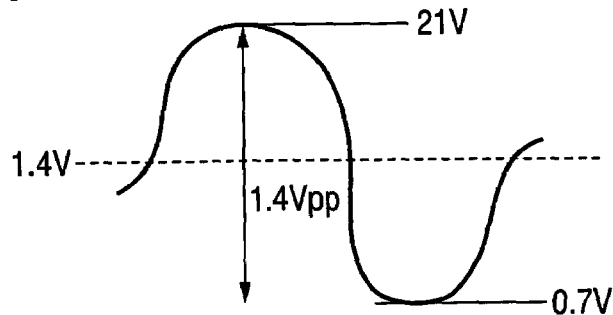
FIG. 7 (A) (B) (C) is an explanatory diagram of an input signal to an A/D converter in a DC offset cancel circuit.
Figure 7B:
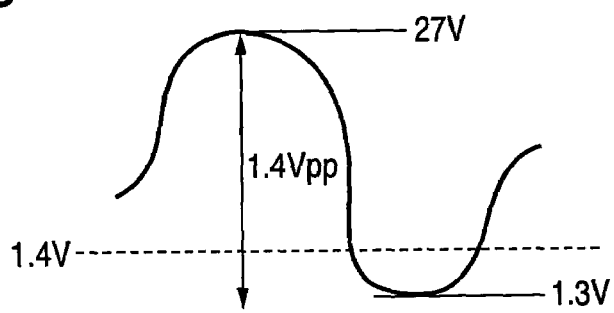
Figure 7C:
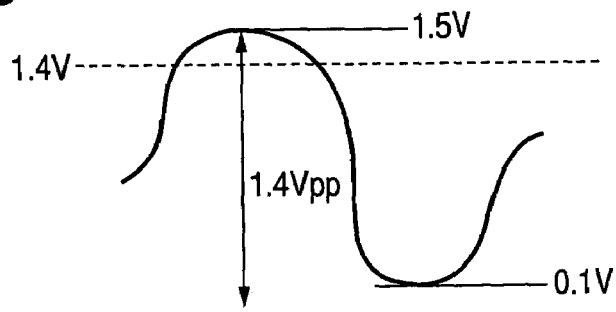

FIG. 4 is a block diagram showing the schematic structure of a DC offset cancel circuit according to the second embodiment of the invention. A DC offset cancel circuit 400 includes an analog adder 1 having one input to which a baseband analog signal output from a high-frequency reception section is input and another input to which an analog correction signal output from a D/A converter 7 to be described later is input, and corrects a reference voltage value of the baseband analog signal to cancel a DC offset analogically, an A/D converter 2 which converts an analog signal output from the analog adder 1 to a digital signal, an adder 3 which subtracts lower bits of an average value stored in a memory 6 to be described later, as a DC offset value, from an output from the A/D converter 2 as one input, an averaging circuit 45 which acquires the average value of the output signal of an output digital value of the A/D converter 2 and outputs the average value to the memory 6 when given an operational instruction, a control section 4 which gives an operational instruction to the averaging circuit 45 in response to a control signal Sc, the memory 6 which stores an average value computed by the averaging circuit 45, and the D/A converter 7 which converts the digital value of the upper bits of an average value stored in the memory 6 to an analog correction signal, and outputs the analog correction signal to the analog adder 1.

Figure 8:
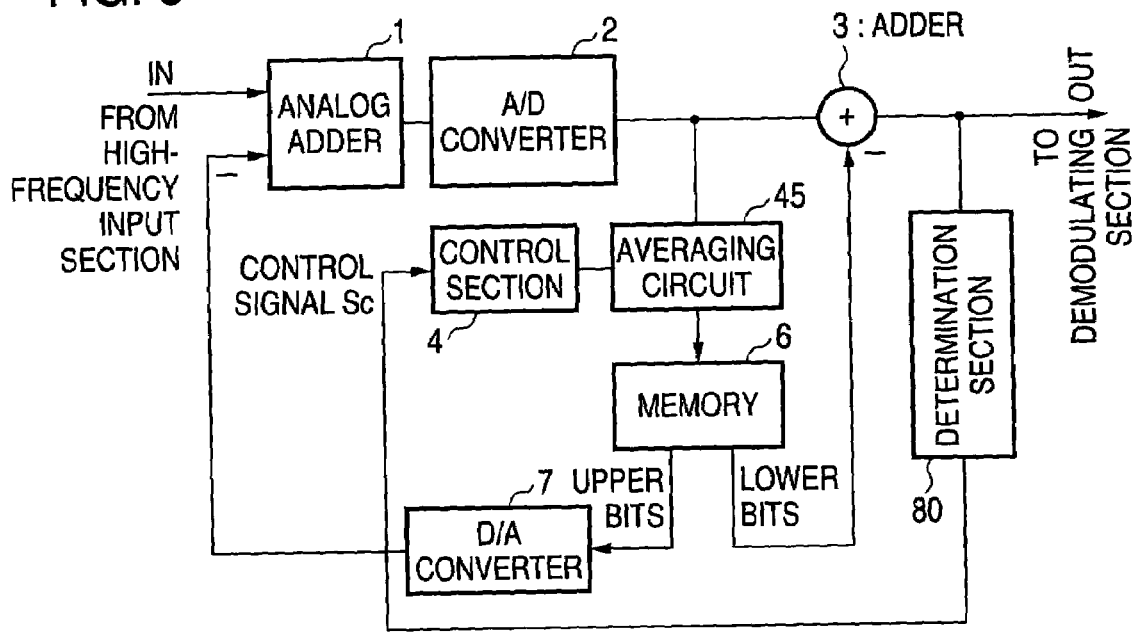
FIG. 8 is a block diagram showing the schematic structure of a DC offset cancel circuit according to the third embodiment of the invention.

FIG. 8 is a block diagram showing the schematic structure of a DC offset cancel circuit according to the third embodiment of the invention. A DC offset cancel circuit 800 includes an analog adder 1 having one input to which a baseband analog signal output from a high-frequency reception section is input and another input to which an analog correction signal output from a D/A converter 7 to be described later is input, and corrects a reference voltage value of the baseband analog signal to cancel a DC offset analogically, an A/D converter 2 which converts an analog signal output from the analog adder 1 to a digital signal, an adder 3 which subtracts lower bits of an average value stored in a memory 6 to be described later, as a DC offset value, from an output from the A/D converter 2 as one input, an averaging circuit 45 which acquires the average value of the output signal of an output digital value of the A/D converter 2 and outputs the average value to the memory 6 when given an operational instruction, a determination section 80 which determines whether a digital signal from an output signal of the adder 3 is originated from a significant signal or noise and outputs a control signal Sc indicating the determination result as significant signal/noise determination information to a control section 4, the control section 4 which gives an operational instruction to the averaging circuit 45 in response to the control signal Sc, the memory 6 which stores an average value computed by the averaging circuit 45, and the D/A converter 7 which converts the digital value of the upper bits of an average value stored in the memory 6 to an analog correction signal, and outputs the analog correction signal to the analog adder 1.

Figure 9:
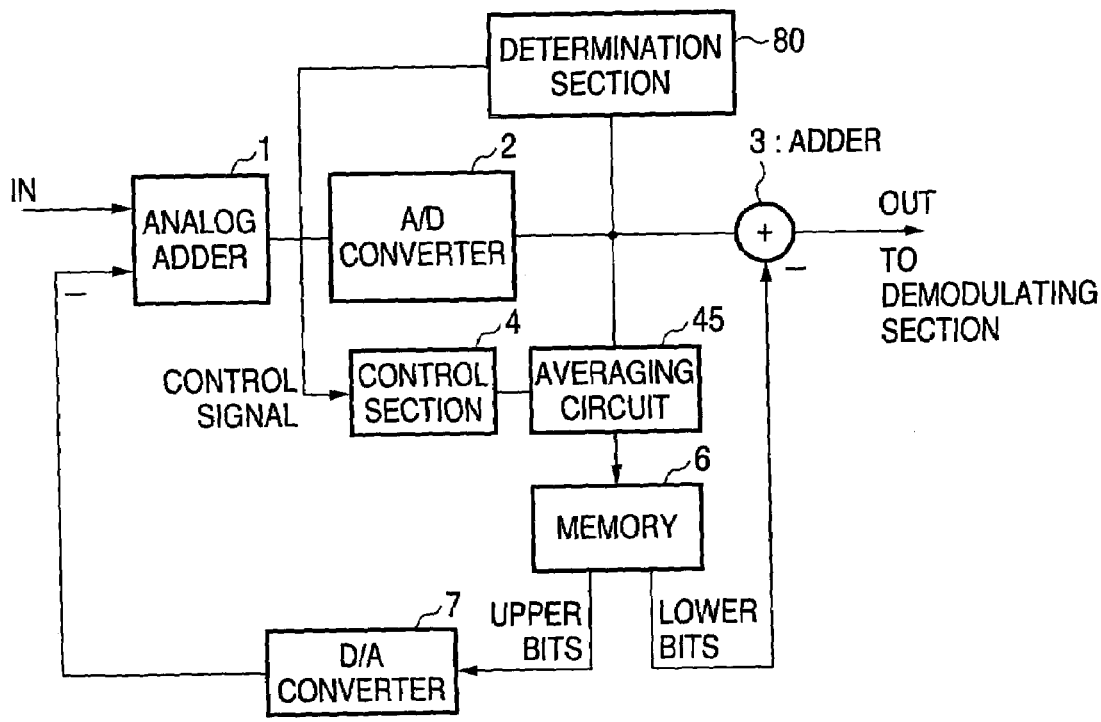
FIG. 9 is a block diagram showing the schematic structure of a DC offset cancel circuit according to the fourth embodiment of the invention.

FIG. 9 is a block diagram showing the schematic structure of a DC offset cancel circuit according to the fourth embodiment of the invention. A DC offset cancel circuit 900 includes an analog adder 1 having one input to which a baseband analog signal output from a high-frequency reception section is input and another input to which an analog correction signal output from a D/A converter 7 to be described later is input, and corrects a reference voltage value of the baseband analog signal to cancel a DC offset analogically, an A/D converter 2 which converts an analog signal output from the analog adder 1 to a digital signal, an adder 3 which subtracts lower bits of an average value stored in a memory 6 to be described later, as a DC offset value, from an output from the A/D converter 2 as one input, an averaging circuit 45 which acquires the average value of the output signal of an output digital value of the A/D converter 2 and outputs the average value to the memory 6 when given an operational instruction, a determination section 80 which determines whether a digital signal from an output signal of the A/D converter 2 is originated from a significant signal or noise and outputs a control signal Sc indicating the determination result as significant signal/noise determination information to a control section 4, the control section 4 which gives an operational instruction to the averaging circuit 45 in response to the control signal Sc, the memory 6 which stores an average value computed by the averaging circuit 45, and the D/A converter 7 which converts the digital value of the upper bits of an average value stored in the memory 6 to an analog correction signal, and outputs the analog correction signal to the analog adder 1.

Figure 10:
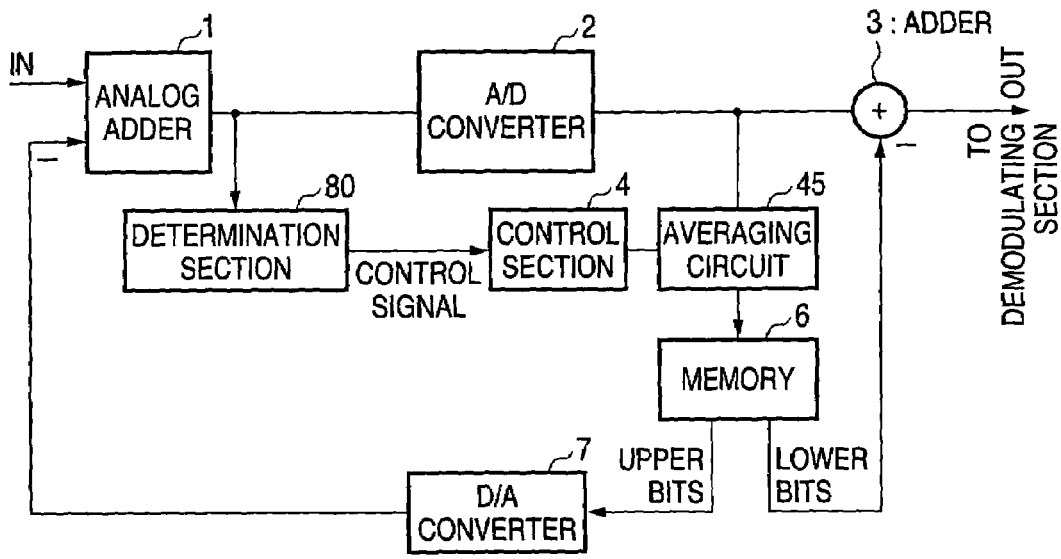
FIG. 10 is a block diagram showing the schematic structure of a DC offset cancel circuit according to the fifth embodiment of the invention.

FIG. 10 is a block diagram showing the schematic structure of a DC offset cancel circuit according to the fifth embodiment of the invention. A DC offset cancel circuit 1000 includes an analog adder I having one input to which a baseband analog signal output from a high-frequency reception section is input and another input to which an analog correction signal output from a D/A converter 7 to be described later is input, and corrects a reference voltage value of the baseband analog signal to cancel a DC offset analogically, an A/D converter 2 which converts an analog signal output from the analog adder I to a digital signal, an adder 3 which subtracts lower bits of an average value stored in a memory 6 to be described later, as a DC offset value, from an output from the A/D converter 2 as one input, an averaging circuit 45 which acquires the average value of the output signal of an output digital value of the A/D converter 2 and outputs the average value to the memory 6 when given an operational instruction, a determination section 80 which determines whether a digital signal from an output signal of the analog adder 1 is originated from a significant signal or noise and outputs a control signal Sc indicating the determination result as significant signal/noise determination information to a control section 4, the control section 4 which gives an operational instruction to the averaging circuit 45 in response to the control signal Sc, the memory 6 which stores an average value computed by the averaging circuit 45, and the D/A converter 7 which converts the digital value of the upper bits of an average value stored in the memory 6 to an analog correction signal, and outputs the analog correction signal to the analog adder 1.

Figure 11:
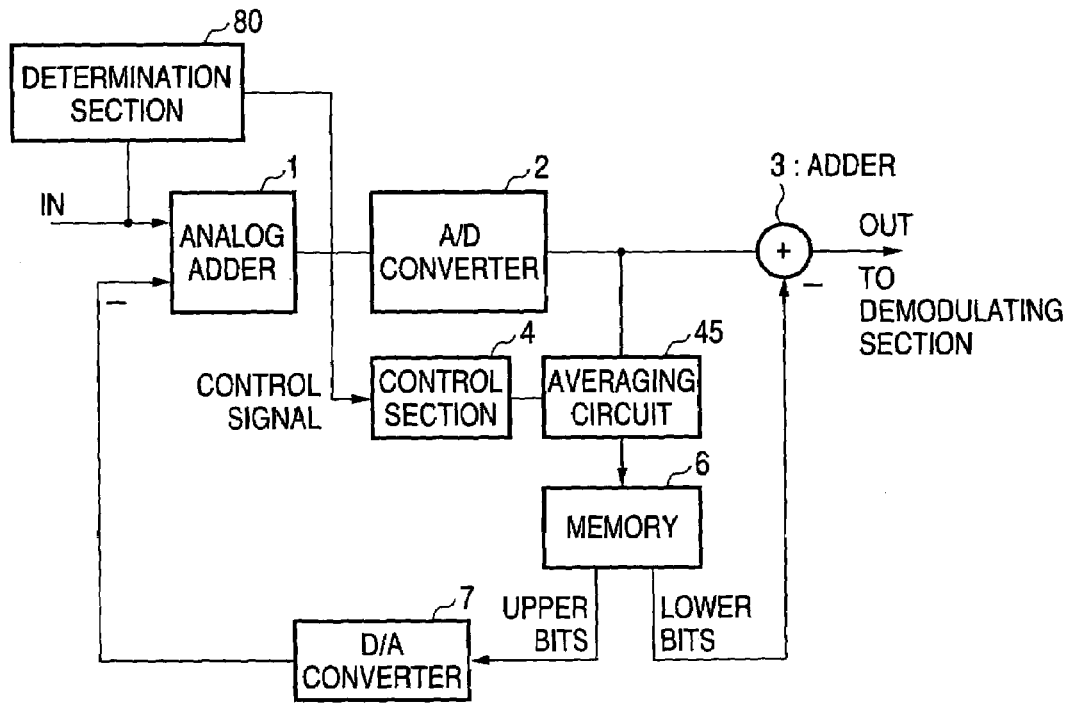
FIG. 11 is a block diagram showing the schematic structure of a DC offset cancel circuit according to the sixth embodiment of the invention.

FIG. 11 is a block diagram showing the schematic structure of a DC offset cancel circuit according to the sixth embodiment of the invention. A DC offset cancel circuit 1100 includes an analog adder 1 having one input to which a baseband analog signal output from a high-frequency reception section is input and another input to which an analog correction signal output from a D/A converter 7 to be described later is input, and corrects a reference voltage value of the baseband analog signal to cancel a DC offset analogically, an A/D converter 2 which converts an analog signal output from the analog adder 1 to a digital signal, an adder 3 which subtracts lower bits of an average value stored in a memory 6 to be described later, as a DC offset value, from an output from the A/D converter 2 as one input, an averaging circuit 45 which acquires the average value of the output signal of an output digital value of the A/D converter 2 and outputs the average value to the memory 6 when given an operational instruction, a determination section 80 which determines whether a digital signal from the baseband analog signal is originated from a significant signal or noise and outputs a control signal Sc indicating the determination result as significant signal/noise determination information to a control section 4, the control section 4 which gives an operational instruction to the averaging circuit 45 in response to the control signal Sc, the memory 6 which stores an average value computed by the averaging circuit 45, and the D/A converter 7 which converts the digital value of the upper bits of an average value stored in the memory 6 to an analog correction signal, and outputs the analog correction signal to the analog adder 1.

Figure 12:
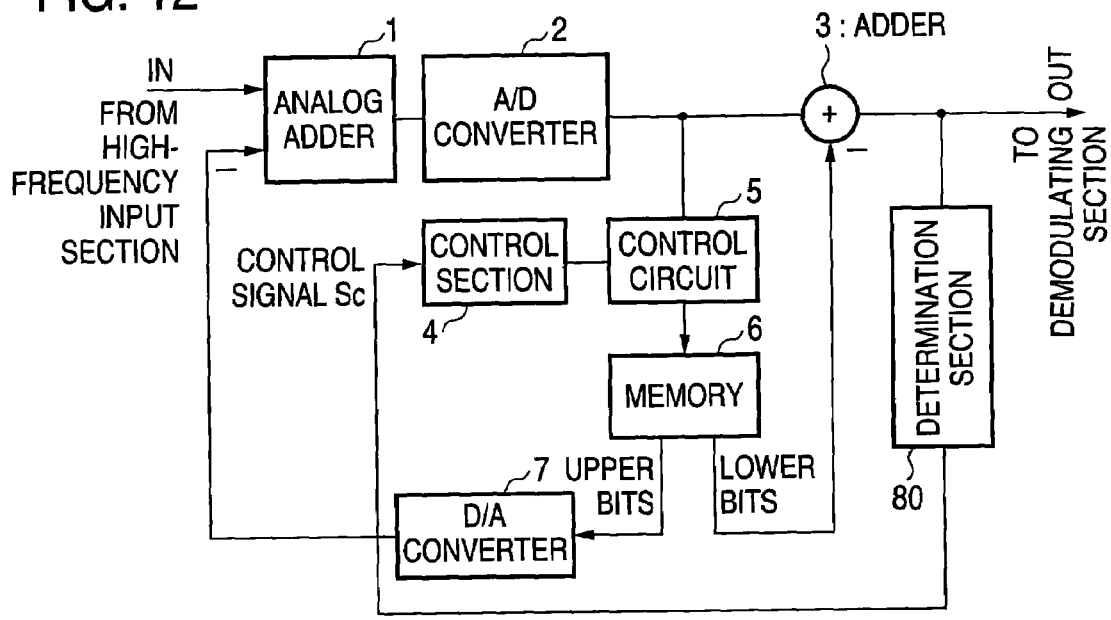
FIG. 12 is a block diagram showing the schematic structure of a DC offset cancel circuit according to the seventh embodiment of the invention.

FIG. 12 is a block diagram showing the schematic structure of a DC offset cancel circuit according to the seventh embodiment of the invention. A DC offset cancel circuit 1200 includes an analog adder 1 having one input to which a baseband analog signal output from a high-frequency reception section is input and another input to which an analog correction signal output from a D/A converter 7 to be described later is input, and corrects a reference voltage value of the baseband analog signal to cancel a DC offset analogically, an A/D converter 2 which converts an analog signal output from the analog adder 1 to a digital signal, an adder 3 which subtracts lower bits of a sample value stored in a memory 6 to be described later, as a DC offset value, from an output from the A/D converter 2 as one input, a control circuit 5 which outputs an output digital value of the A/D converter 2 as a sample value to the memory 6 when given an operational instruction, a determination section 80 which determines whether a digital signal from an output signal of the adder 3 is originated from a significant signal or noise and outputs a control signal Sc indicating the determination result as significant signal/noise determination information to a control section 4, the control section 4 which gives an operational instruction to the control circuit 5 in response to the control signal Sc, the memory 6 which stores a sample value extracted by the control circuit 5, and the D/A converter 7 which converts the digital value of the upper bits of a sample value stored in the memory 6 to an analog correction signal, and outputs the analog correction signal to the analog adder 1.

Figure 13:
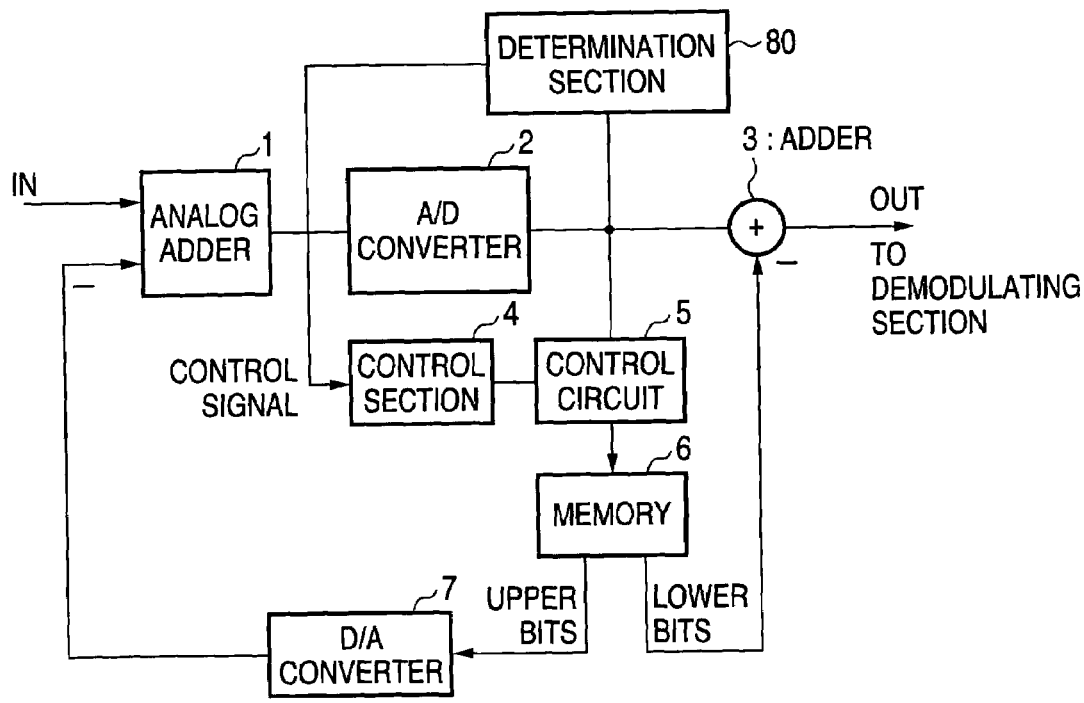
FIG. 13 is a block diagram showing the schematic structure of a DC offset cancel circuit according to the eighth embodiment of the invention.

FIG. 13 is a block diagram showing the schematic structure of a DC offset cancel circuit according to the eighth embodiment of the invention. A DC offset cancel circuit 1300 includes an analog adder 1 having one input to which a baseband analog signal output from a high-frequency reception section is input and another input to which an analog correction signal output from a D/A converter 7 to be described later is input, and corrects a reference voltage value of the baseband analog signal to cancel a DC offset analogically, an A/D converter 2 which converts an analog signal output from the analog adder I to a digital signal, an adder 3 which subtracts lower bits of a sample value stored in a memory 6 to be described later, as a DC offset value, from an output from the A/D converter 2 as one input, a control circuit 5 which outputs an output digital value of the A/D converter 2 as a sample value to the memory 6 when given an operational instruction, a determination section 80 which determines whether a digital signal from an output signal of the A/D converter 2 is originated from a significant signal or noise and outputs a control signal Sc indicating the determination result as significant signal/noise determination information to a control section 4, the control section 4 which gives an operational instruction to the control circuit 5 in response to the control signal Sc, the memory 6 which stores a sample value extracted by the control circuit 5, and the D/A converter 7 which converts the digital value of the upper bits of a sample value stored in the memory 6 to an analog correction signal, and outputs the analog correction signal to the analog adder 1.

Figure 14:
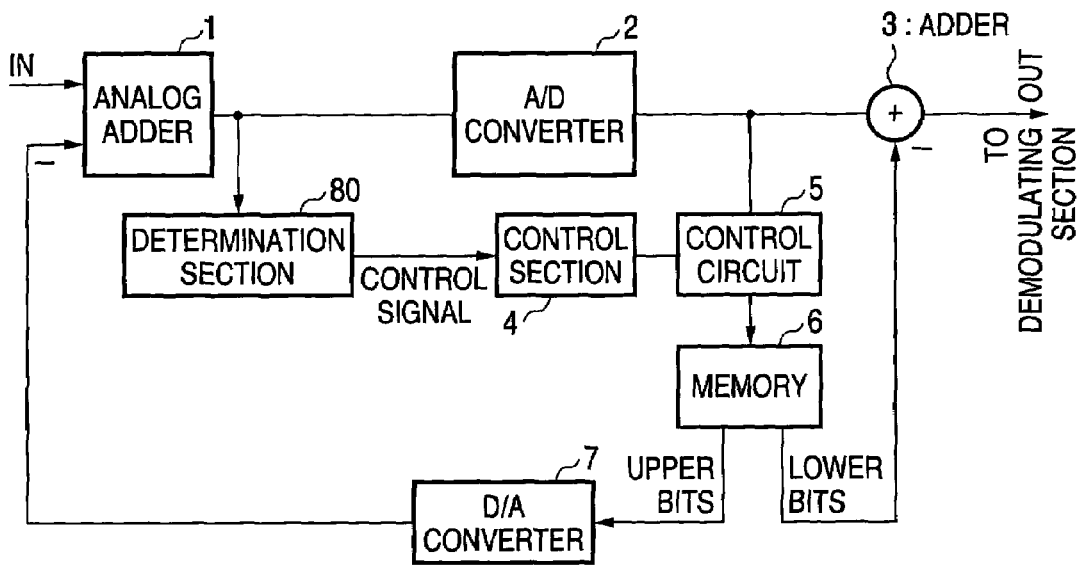
FIG. 14 is a block diagram showing the schematic structure of a DC offset cancel circuit according to the ninth embodiment of the invention.

FIG. 14 is a block diagram showing the schematic structure of a DC offset cancel circuit according to the ninth embodiment of the invention. A DC offset cancel circuit 1400 includes an analog adder 1 having one input to which a baseband analog signal output from a high-frequency reception section is input and another input to which an analog correction signal output from a D/A converter 7 to be described later is input, and corrects a reference voltage value of the baseband analog signal to cancel a DC offset analogically, an A/D converter 2 which converts an analog signal output from the analog adder 1 to a digital signal, an adder 3 which subtracts lower bits of a sample value stored in a memory 6 to be described later, as a DC offset value, from an output from the A/D converter 2 as one input, a control circuit 5 which outputs an output digital value of the A/D converter 2 as a sample value to the memory 6 when given an operational instruction, a determination section 80 which determines whether a digital signal from an output signal of the analog adder 1 is originated from a significant signal or noise and outputs a control signal Sc indicating the determination result as significant signal/noise determination information to a control section 4, the control section 4 which gives an operational instruction to the control circuit 5 in response to the control signal Sc, the memory 6 which stores a sample value extracted by the control circuit 5, and the D/A converter 7 which converts the digital value of the upper bits of a sample value stored in the memory 6 to an analog correction signal, and outputs the analog correction signal to the analog adder 1.

Figure 15:
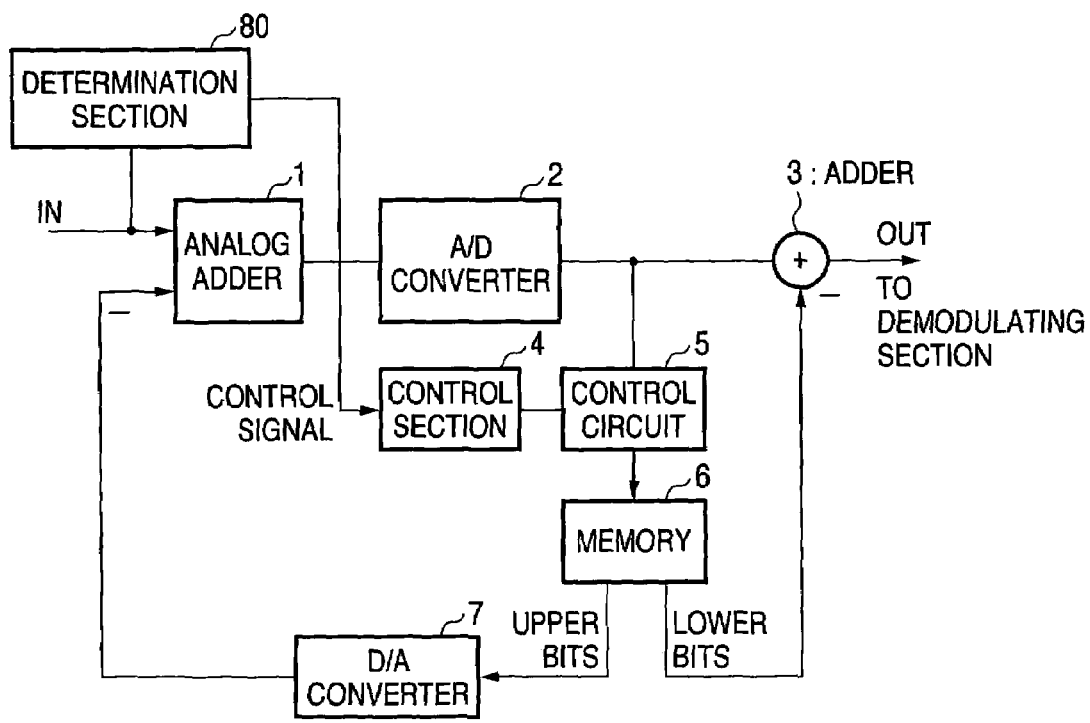
FIG. 15 is a block diagram showing the schematic structure of a DC offset cancel circuit according to the tenth embodiment of the invention.

FIG. 15 is a block diagram showing the schematic structure of a DC offset cancel circuit according to the tenth embodiment of the invention. A DC offset cancel circuit 1500 includes an analog adder 1 having one input to which a baseband analog signal output from a high-frequency reception section is input and another input to which an analog correction signal output from a D/A converter 7 to be described later is input, and corrects a reference voltage value of the baseband analog signal to cancel a DC offset analogically, an A/D converter 2 which converts an analog signal output from the analog adder 1 to a digital signal, an adder 3 which subtracts lower bits of a sample value stored in a memory 6 to be described later, as a DC offset value, from an output from the A/D converter 2 as one input, a control circuit 5 which outputs an output digital value of the A/D converter 2 as a sample value to the memory 6 when given an operational instruction, a determination section 80 which determines whether a digital signal from the baseband analog signal is originated from a significant signal or noise and outputs a control signal Sc indicating the determination result as significant signal/noise determination information to a control section 4, the control section 4 which gives an operational instruction to the control circuit 5 in response to the control signal Sc, the memory 6 which stores a sample value extracted by the control circuit 5, and the D/A converter 7 which converts the digital value of the upper bits of a sample value stored in the memory 6 to an analog correction signal, and outputs the analog correction signal to the analog adder 1.

Figure 16:
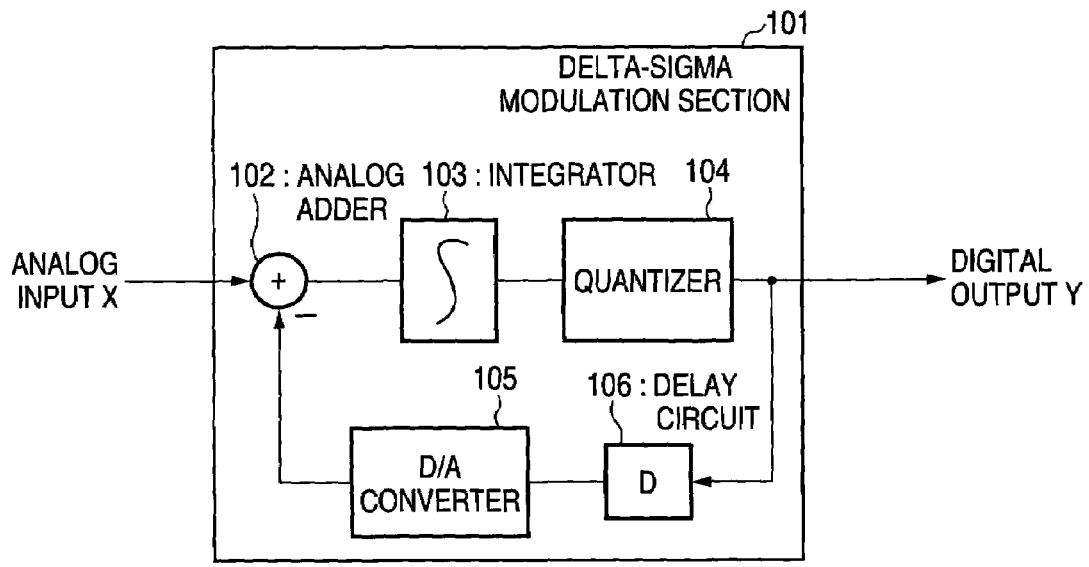
FIG. 16 (A) (B) is a block diagram showing the schematic structure of a first-order delta-sigma modulation type A/D converter.

FIG. 16 is a block diagram showing the schematic structure of a first-order delta-sigma modulation type A/D converter which is a typical example of an A/D converter having an analog adder and a D/A converter, which outputs a feedback analog signal for A/D conversion to the analog adder, in the A/D converter 2 in the schematic structures of the DC offset cancel circuits according to the first to tenth embodiment of the invention.

The first-order delta-sigma modulation type A/D converter in FIG. 16(*a*) is comprised of a delta-sigma modulation section 101 that has an analog adder 102 to whose one input an analog signal X is input and to whose other input a feedback analog signal output from a D/A converter 105 to be described later is input, and which subtracts the feedback analog signal from the input analog signal, an integrator 103 which integrates an analog signal output from the analog adder 102, a quantizer 104 which quantizes an output of the integrator 103 to a digital signal, a delay circuit 106 which adjusts the output timing of the quantizer 104, and the D/A converter 105 which converts an output of the delay circuit 106 to an analog signal.

It is well known that given that the output of the quantizer 104 is Y which is the result of A/D conversion, and quantization noise generated by the quantizer 104 is Q, the transfer function in the Z area is given by the following equation 1.

$$Y = X + (1 - Z^{-1})Q \quad \text{[Equation 1]}$$

and the input analog signal X remains as it is, and only the quantization noise Q gets the first-order noise shaping effect by the term given by the following equation 2, so that low-frequency noise is improved, and the first-order noise shaping effect, together with the oversampling effect, provides the function of an A/D converter.

$$(1 - Z^{-1}) \quad \text{[Equation 2]}$$

Another first-order delta-sigma modulation type A/D converter shown in FIG. 16(*b*) is a structural example of an A/D converter where a decimation digital filter 107, which limits the band of an oversampled digital signal to the Nyquist rate that is generally needed, and lowers the sampling rate while eliminating a return image, is provided at the subsequent stage of the circuit in FIG. 16(*a*).

The structures and advantages of various oversampling A/D converters which are a delta-sigma modulation system, a delta modulation system, a modulation system called a hybrid type or an interpolation type which is a combination of those two systems, and types developed from those modulation systems are described in "Oversampling A-D Converting Technology" by Akira Yukawa, Nikkei BP Inc., and "Delta-Sigma Data Converters, Theory, Design, and Simulation" by Steven R. Norsworthy, et al., IEEE PRESS (which are partly incorporated in the present specification by reference).

Figure 17:
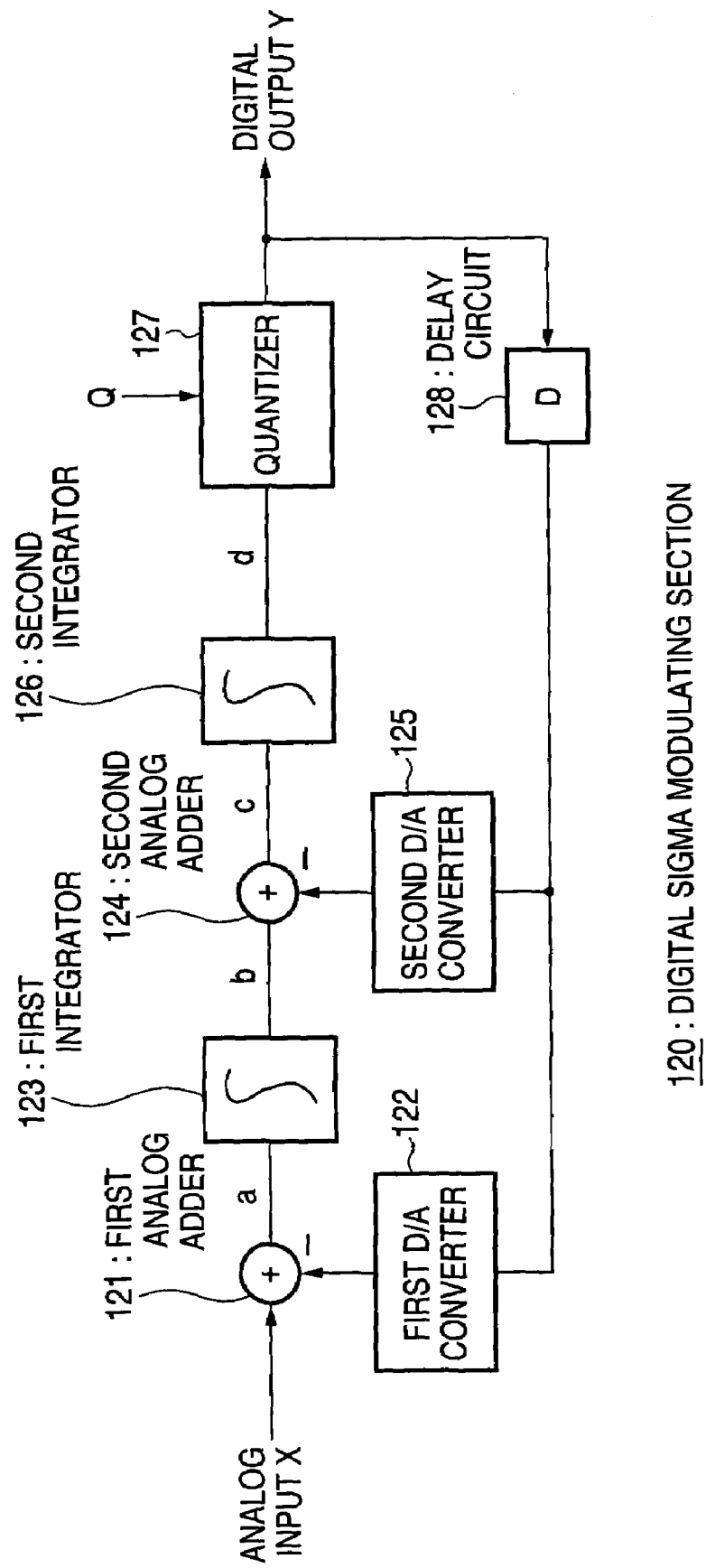
FIG. 17 is a block diagram showing the schematic structure of a second-order delta-sigma modulation section.

FIG. 17 shows another structural example of the delta-sigma modulation section 101 in FIG. 16, and this structure can provide a noise shaping effect having the secondary characteristic, improve the oversampling rate, and achieve A/D conversion with a higher performance.

A delta-sigma modulation section 120 has a first analog adder 121 to whose one input an analog signal X is input and to whose other input a first feedback analog signal output from a first D/A converter 122 to be described later is input, and which subtracts the first feedback analog signal from the input analog signal, a first integrator 123 which integrates an analog signal output from the first analog adder 121, a second analog adder 124 to whose one input an output from the first integrator 123 is input and to whose other input a second feedback analog signal output from a second D/A converter 125 to be described later is input, and which subtracts the second feedback analog signal from the input analog signal, a second integrator 126 which integrates an analog signal output from the second analog adder 124, a quantizer 127 which quantizes an output of the second integrator 126 to a digital signal, a delay circuit 128 which adjusts the output timing of the quantizer 127, and the first and second D/A converters 122 and 125 which convert an output of the delay circuit 128 to analog signals.

Using the structural example of the second-order delta-sigma modulation section 120, a description will be given of the fact that when the A/D converter 2 in the DC offset cancel circuit according to the invention is an A/D converter including an analog adder and a D/A converter which outputs a feedback analog signal for A/D conversion to the analog adder, the analog adder can share a function of subtracting, from an analog signal input to one end, an analog correction signal input from the other end, similar to the function of the analog adder 1 in the DC offset cancel circuits, and a function of adding or subtracting the feedback analog signal for A/D conversion, and the D/A converter can share a function of performing D/A conversion of the upper bits of a value stored in the memory 6 storing a sample value extracted by the control circuit 5 or an average value computed by the averaging circuit 45 and a function of performing D/A conversion of the feedback analog signal for normal A/D conversion.

For example, let us consider a case where the quantizer 127 in FIG. 17 is a so-called 1-bit quantizer which outputs a digital signal of +1 when the input signal to the quantizer 127 is equal to or greater than an analog reference voltage as a threshold and outputs a digital signal of −1 when the input signal is equal to or smaller than the threshold, the quantizer 127 adds quantization noise Q to the digital signal, the first and second D/A converters 122 and 125 convert the digital signals of ±1 to analog signals of ±1, and the transfer functions of the first and second integrators 123 and 126 in the Z area are given by the following equation 3, $$\frac{1}{1-Z^{-1}} \quad \text{[Equation 3]}$$

and the delay circuit 128 is expressed by the following equation 4.

$$Z^{-1} \quad \text{[Equation 4]}$$

Here, the analog input signal is X and the digital output signal is Y. At this time, individual points a, b, c and d in FIG. 17 become as follows.

$$a = X - Y \cdot Z^{-1} \quad \text{[Equation 5]}$$

$$b = \frac{a}{1-Z^{-1}} \quad \text{[Equation 6]}$$

Thus, $$b = \frac{X - Y \cdot Z^{-1}}{1-Z^{-1}} \text{ or} \quad \text{[Equation 7]}$$

$$c = b - Y \cdot Z^{-1} \quad \text{[Equation 8]}$$

$$d = \frac{c}{1-Z^{-1}} \quad \text{[Equation 9]}$$

Thus, $$d = \frac{b - Y \cdot Z^{-1}}{1-Z^{-1}} \text{ or} \quad \text{[Equation 10]}$$

$$Y = d + Q \quad \text{[Equation 11]}$$

Thus, $$Y = \frac{b - Y \cdot Z^{-1}}{1-Z^{-1}} + Q \quad \text{[Equation 12]}$$

Expanding these equations, various terms cancel one another out, yielding $$Y = X + (1-Z^{-1})^2 \cdot Q \quad \text{[Equation 13]}$$

It is well known that given that the input analog signal X remains as it is, and only the quantization noise Q gets the second-order noise shaping effect by the term given by the following equation 14, low-frequency noise is improved, and the second-order noise shaping effect, together with the oversampling effect, achieves high-performance A/D conversion.

$$(1-Z^{-1})^2 \quad \text{[Equation 14]}$$

Canceling a DC offset in an A/D converter is equivalent to an operation of subtracting a DC offset α from the analog signal X when the digital signal Y has the DC offset α and becomes Y+α.

Let us consider a case where the analog adder 121 immediately before the point a is shared to cancel a DC offset. In this case, the DC offset α of the digital signal Y is subtracted by sharing another D/A converter different from the first D/A converter 122 in the second-order delta-sigma modulation section 120 in analog addition immediately before the point a, the point a becomes $$a = X - \alpha - Y \cdot Z^{-1} \quad \text{[Equation 15]}$$

and Y finally becomes $$Y = X - \alpha'(1-Z^{-1})^2 \cdot Q \quad \text{[Equation 16]}$$

That is, α is subtracted from X in the equation of Y, and it is apparent that the analog adder for A/D conversion positioned at the input section of the delta-sigma modulation type A/D converter and the analog adder for canceling a DC offset can be shared by the analog adder 121 immediately before point a, and two D/A converters can easily be shared by coupling another D/A converter different from the first D/A converter 122 in the second-order delta-sigma modulation section 120 at the input section or the output section of the D/A converter.

In the case where the first objective is to reduce the input dynamic range of the input section of the A/D converter, when the A/D converter 2 in the DC offset cancel circuit according to the invention is an A/D converter including an analog adder and a D/A converter which outputs a feedback analog signal for A/D conversion to the analog adder, it is the most rational and economic mode to share A/D conversion and the function of canceling a DC offset by using the analog adder located at the input section of the A/D converter, however, the use of an analog adder in the A/D converter at a section other than the input section can provide a similar effect of reducing the dynamic range of an analog circuit, such as an integrator, at the subsequent stage of the analog adder. A combination of simultaneously sharing analog adders at the input section and a section other than the input section can also be realized. The following will explain the principle.

Let us consider a case where the analog adder 124 immediately before the point c is shared to cancel a DC offset. The point c when the DC offset α is not canceled is $$c = \frac{X - Y \cdot Z^{-1}}{1-Z^{-1}} - Y \cdot Z^{-1} \quad \text{[Equation 17]}$$

Here, to set X to X−α, the following equation should be given.

$$c = \frac{X - Y \cdot Z^{-1}}{1-Z^{-1}} - Y \cdot Z^{-1} - \frac{\alpha}{1-Z^{-1}} \quad \text{[Equation 18]}$$

This becomes $$c = \frac{X - \alpha - Y \cdot Z^{-1}}{1-Z^{-1}} - Y \cdot Z^{-1} \quad \text{[Equation 19]}$$

and Y finally becomes $$Y = X - \alpha + (1-Z^{-1})^2 \cdot Q \quad \text{[Equation 20]}$$

That is, an arithmetic operation given by the following equation 21 is performed on α to correct it, the DC offset α can be canceled from the analog signal X, and the analog adder 124 immediately before the point c can share an analog adder for A/D conversion located inside the delta-sigma modulation type A/D converter and an analog adder for canceling a DC offset.

$$\frac{1}{1-Z^{-1}} \quad \text{[Equation 21]}$$

In the case of dividing a to two DC offsets β and γ, applying the above-described development of the equations, subtracting β by the analog adder 121 immediately before the point a and γ by the analog adder 124 immediately before the point c, and performing an arithmetic operation given by the following equation 22 on γ yields an equation 23.

$$\frac{1}{1-Z^{-1}} \quad \text{[Equation 22]}$$

$$Y = X - \beta - \gamma + (1-Z^{-1})^2 \cdot Q \quad \text{[Equation 23]}$$

It is possible to cancel a DC offset α=β+γ from the analog signal X and simultaneously use the analog adder 121 for A/D conversion immediately before the point a located at the input section of the delta-sigma modulation type A/D converter, and the analog adder 124 for A/D conversion immediately before the point c and the analog adder for canceling a DC offset, both located inside the delta-sigma modulation type A/D converter.

Although the description has been given of the second-order delta-sigma modulation type A/D converter, the same idea can be applied to a case of the first-order delta-sigma modulation type A/D converter as well as a high-order delta-sigma modulation type A/D converter higher than the third order.

Several embodiments to which the principle is adapted will be discussed below.

Figure 18:
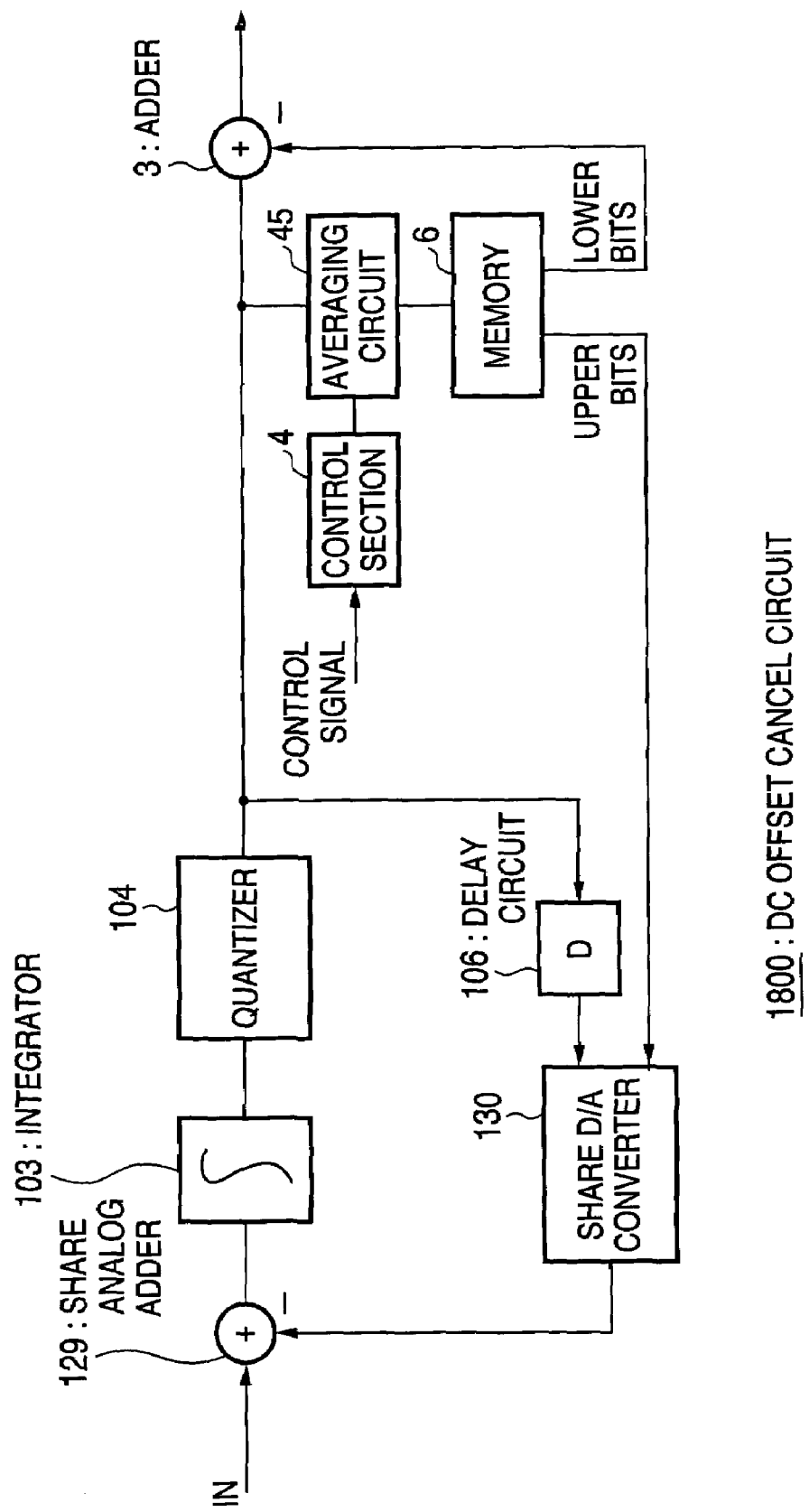
FIG. 18 is a block diagram showing the schematic structure of the DC offset cancel circuit according to the second embodiment of the invention to which a first-order delta-sigma modulation type A/D converter is adapted in the eleventh embodiment of the invention.

FIG. 18 is a block diagram showing the schematic structure of a DC offset cancel circuit according to the eleventh embodiment of the invention, and shows one structural example where the delta-sigma modulation type A/D converter in FIG. 16(a) is adapted to the DC offset cancel circuit 400 according to the second embodiment of the invention.

A DC offset cancel circuit 1800 in FIG. 18 includes a share analog adder 129 which shares subtraction of a feedback analog signal for A/D conversion in the delta-sigma modulation type A/D with an analog adder to whose one input a baseband analog signal output from a high-frequency reception section is input and whose other input an analog signal output from a share D/A converter 130 to be described later is input, and which corrects a reference voltage value of the baseband analog signal to cancel a DC offset analogically, an integrator 103 which integrates an analog signal output from the share analog adder 129, a quantizer 104 which quantizes an output of the integrator 103 to a digital signal, a delay circuit 106 which adjusts the output timing of the quantizer 104, and the share D/A converter 130 which converts an analog signal by sharing the function of converting an output of the delay circuit 106 and the digital value of the upper bits of an average value stored in a memory 6 to be described later to analog signals. The DC offset cancel circuit 1800 further includes an adder 3 which has an output of the quantizer 104 as one input and subtracts the lower bits of an average value stored in the memory 6 as a DC offset value from the input value, and outputs the resultant value, an averaging circuit 45 which acquires an average value of an output signal of an output digital value of the quantizer 104 and outputs the average value to the memory 6 when given an operational instruction, a control section 4 which gives an operational instruction to the averaging circuit 45 in response to a control signal Sc, and the memory 6 which stores an average value computed by the averaging circuit 45.

Because the delta-sigma modulation type A/D converter in FIG. 16(a) in FIG. 18 does not have a decimation digital filter, which limits the band of an oversampled digital signal to the Nyquist rate that is generally needed, and lowers the sampling rate while eliminating a return image, inside the A/D converter, an A/D conversion result contains many high-frequency components, so that an A/D conversion result as a DC offset is hard to acquire without an averaging process as compared with the ordinary Nyquist rate A/D converter.

Therefore, the control circuit 5 in FIG. 1 which outputs the output digital value of the A/D converter as a sample value to the memory 6 when given an operational instruction is not adequate for a DC offset cancel circuit, and the structure that acquires an average value by means of the averaging circuit 45 is more desirable.

Figure 16B:
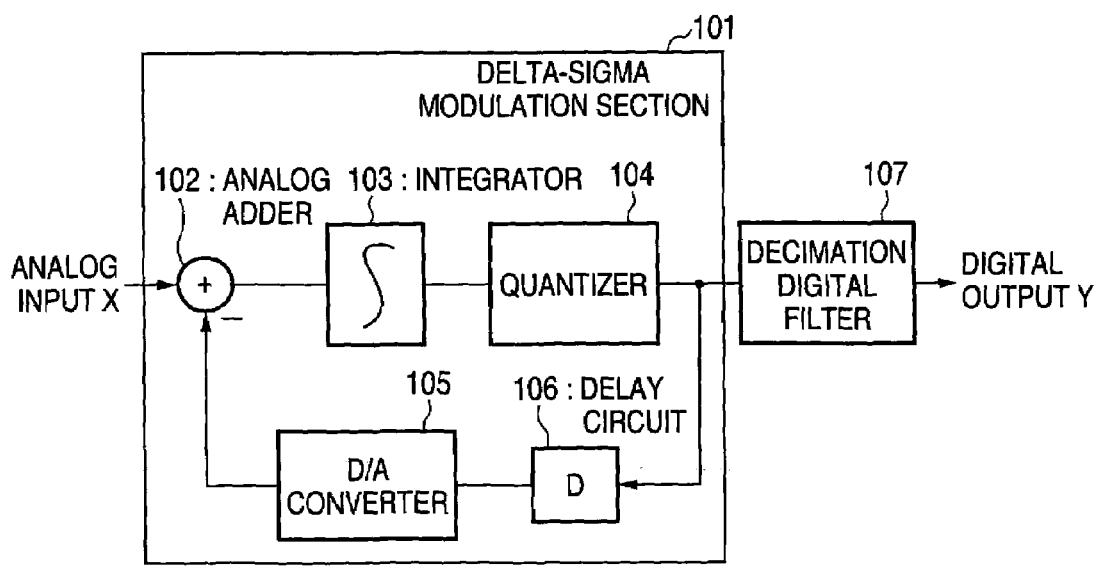
Figure 19:
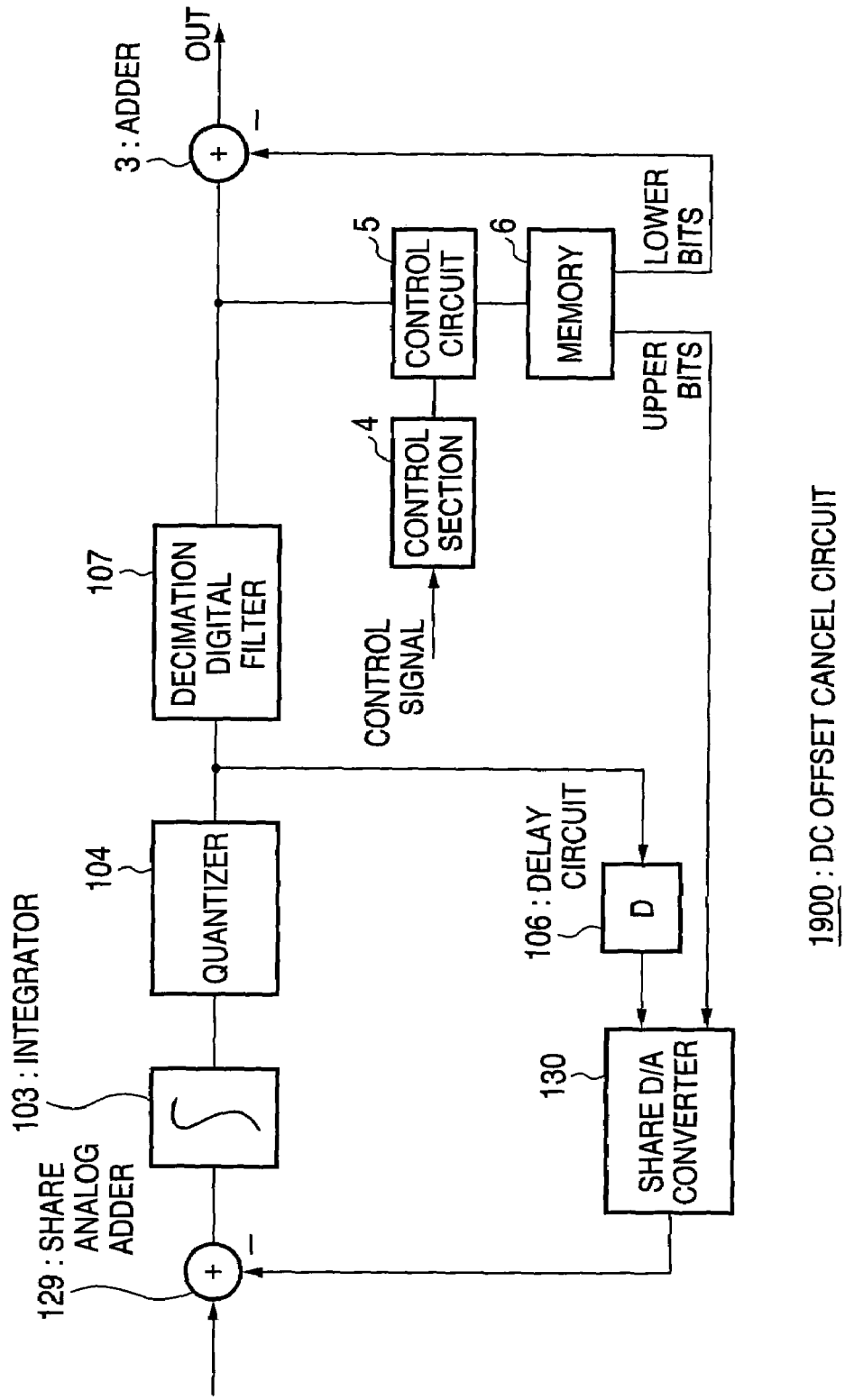
FIG. 19 is a block diagram showing the schematic structure of the DC offset cancel circuit according to the first embodiment of the invention to which a first-order delta-sigma modulation type A/D converter is adapted in the twelfth embodiment of the invention.

FIG. 19 is a block diagram showing the schematic structure of a DC offset cancel circuit according to the twelfth embodiment of the invention, and shows one structural example where the delta-sigma modulation type A/D converter in FIG. 16(b) is adapted to the DC offset cancel circuit 100 in FIG. 1 according to the first embodiment of the invention.

A DC offset cancel circuit 1900 in FIG. 19 includes a share analog adder 129 which shares subtraction of a feedback analog signal for A/D conversion in the delta-sigma modulation type A/D with an analog adder to whose one input a baseband analog signal output from a high-frequency reception section is input and whose other input an analog signal output from a share D/A converter 130 to be described later is input, and which corrects a reference voltage value of the baseband analog signal to cancel a DC offset analogically, an integrator 103 which integrates an analog signal output from the share analog adder 129, a quantizer 104 which quantizes an output of the integrator 103 to a digital signal, a delay circuit 106 which adjusts the output timing of the quantizer 104, and the share D/A converter 130 which converts an analog signal by sharing the function of converting an output of the delay circuit 106 and the digital value of the upper bits of an average value stored in a memory 6 to be described later to analog signals. The DC offset cancel circuit 1900 further includes a decimation digital filter 107 which is located between the quantizer 104 and an adder 3, and limits the band of an output of the quantizer 104 and lowers the sampling rate while eliminating a return image, the adder 3 which has an output of the decimation digital filter 107 as its one input and subtracts the lower bits of a sample value stored in the memory 6 as a DC offset value from the input value and outputs the resultant value, a control circuit 5 which outputs an output digital value of the decimation digital filter 107 as a sample value to the memory 6 when given an operational instruction, a control section 4 which gives an operational instruction to the control circuit 5 in response to a control signal Sc, and the memory 6 which stores a sample value extracted by the control circuit 5.

Because the delta-sigma modulation type A/D converter in FIG. 16(*b*) in FIG. 19 has a decimation digital filter 107, which limits the band of an oversampled digital signal to the Nyquist rate that is generally needed, and lowers the sampling rate while eliminating a return image, inside the A/D converter, the A/D converter, like the ordinary Nyquist rate A/D converter, can handle digital signals, and the control circuit 5 to which an operational instruction is given by the control section 4, demonstrates a sufficient DC offset cancel effect by outputting an output digital value of the A/D converter as a sample value to the memory 6 when given an operational instruction, however, replacing the control circuit 5 with the averaging circuit 45 as shown in FIG. 4 brings about a DC offset cancel effect with a high accuracy.

Figure 20:
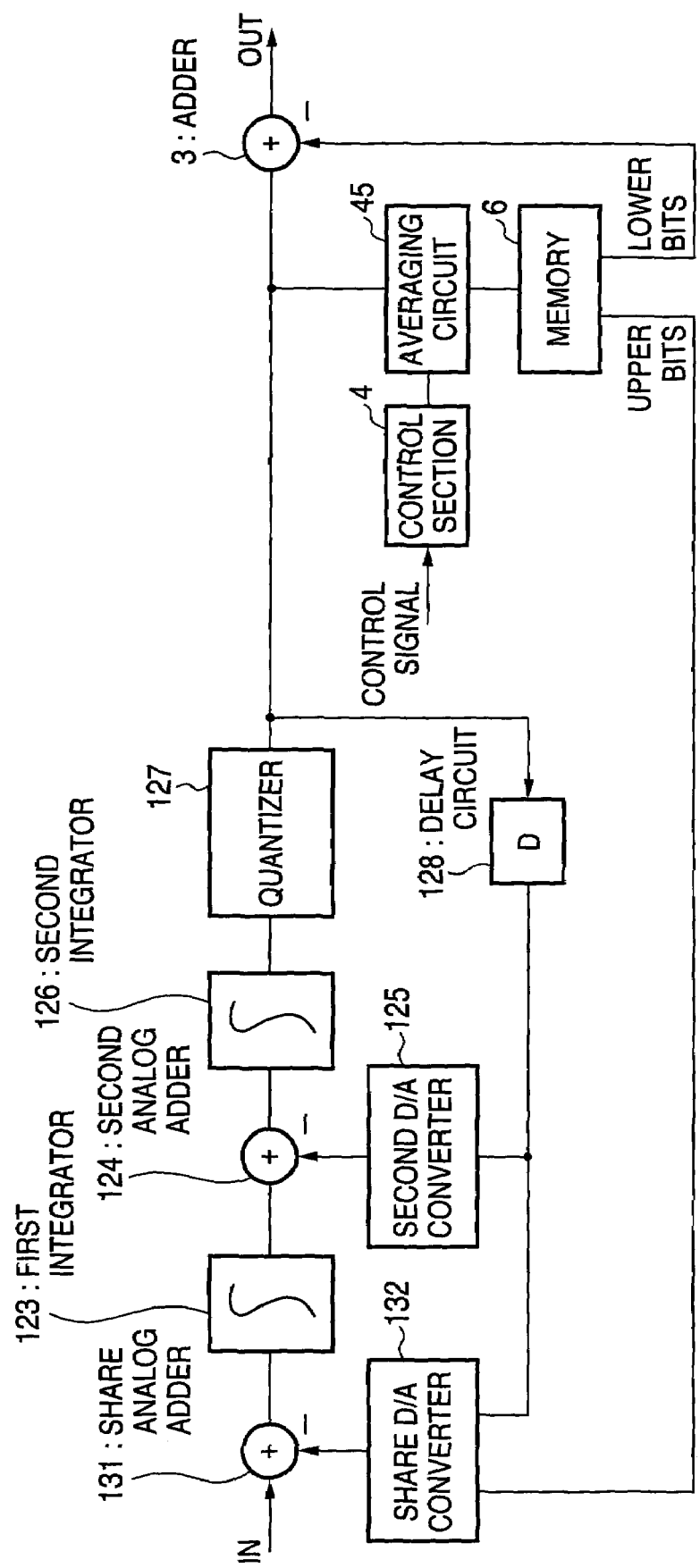
FIG. 20 is a block diagram showing the schematic structure of the DC offset cancel circuit according to the second embodiment of the invention to which a second-order delta-sigma modulation type A/D converter is adapted in the thirteenth embodiment of the invention.

FIG. 20 is a block diagram showing the schematic structure of a DC offset cancel circuit according to the thirteenth embodiment of the invention, and shows one structural example where the second-order delta-sigma modulation type A/D converter shown in FIG. 17 capable of bringing about a noise shaping effect with the secondary characteristic and realizing A/D conversion of higher performance is adapted to the DC offset cancel circuit 400 in FIG. 4 according to the second embodiment of the invention.

A DC offset cancel circuit 2000 in FIG. 20 includes a share analog adder 131 which shares subtraction of a first feedback analog signal for A/D conversion in the delta-sigma modulation type A/D with an analog adder to whose one input a baseband analog signal output from a high-frequency reception section is input and whose other input an analog signal output from a share D/A converter 132 to be described later is input, and which corrects a reference voltage value of the baseband analog signal to cancel a DC offset analogically, a first integrator 123 which integrates an analog signal output from the share analog adder 131, a second analog adder 124 which has an output of the first integrator 123 as its one input and to whose other input a second feedback analog signal output from a second D/A converter 125 to be described later is input, and which subtracts the second feedback analog signal from the input analog signal, a second integrator 126 which integrates an analog signal output from the second analog adder 124, a quantizer 127 which quantizes an output of the second integrator 126 to a digital signal, a delay circuit 128 which adjusts the output timing of the quantizer 127, the second D/A converter 125 which converts an output of the delay circuit 128 to an analog signal, and the share D/A converter 132 which converts an analog signal by sharing the function of converting an output of the delay circuit 128 and the digital value of the upper bits of an average value stored in a memory 6 to be described later to analog signals. The DC offset cancel circuit 2000 further includes an adder 3 which has an output of the quantizer 127 as its one input and subtracts the lower bits of an average value stored in the memory 6 as a DC offset value from the input value and outputs the resultant value, an averaging circuit 45 which acquires an average value of an output signal of an output digital value of the quantizer 127 and outputs the average value to the memory 6 when given an operational instruction, a control section 4 which gives an operational instruction to the averaging circuit 45 in response to a control signal Sc, and the memory 6 which stores an average value computed by the averaging circuit 45.

Figure 21:
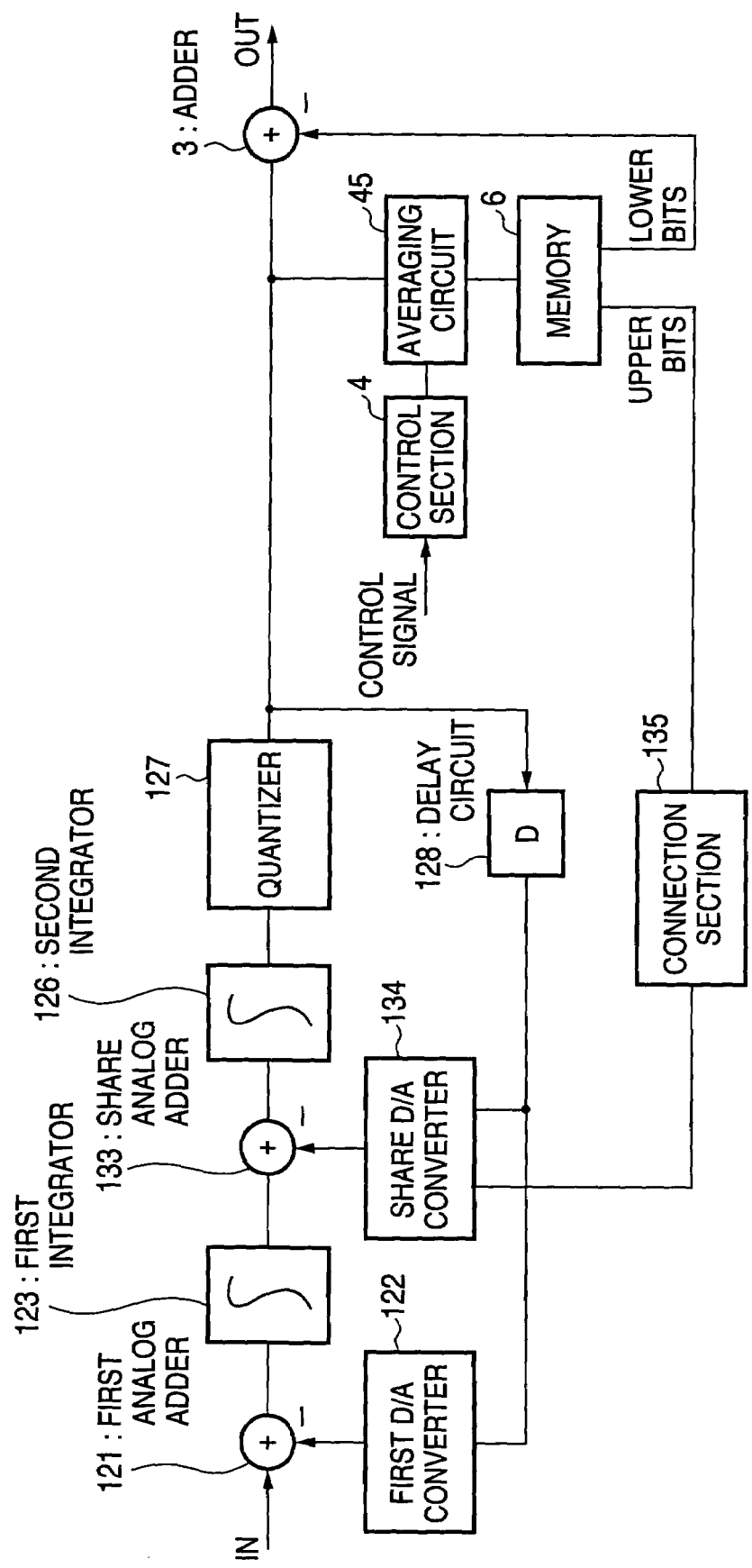
FIG. 21 is a block diagram showing the schematic structure of the DC offset cancel circuit according to the second embodiment of the invention to which a second-order delta-sigma modulation type A/D converter is adapted in the fourteenth embodiment of the invention.

FIG. 21 is a block diagram showing the schematic structure of a DC offset cancel circuit according to the fourteenth embodiment of the invention, and shows a second structural example where the second-order delta-sigma modulation type A/D converter shown in FIG. 17 capable of bringing about a noise shaping effect with the secondary characteristic and realizing A/D conversion of higher performance is adapted to the DC offset cancel circuit 400 in FIG. 4 according to the second embodiment of the invention.

A DC offset cancel circuit 2100 in FIG. 21 includes a first analog adder 121 to whose one input a baseband analog signal output from a high-frequency reception section is input and to which another input of a first feedback analog signal for A/D conversion in the second-order delta-sigma modulation type A/D converter output from a first D/A converter 122 to be described later is input, a first integrator 123 which integrates an analog signal output from the first analog adder 121, a share analog adder 133 which shares an analog adder to which one input an output of the first integrator 123 is input and to whose other input an analog signal output from a share D/A converter 134 to be described later is input, and correcting a reference voltage value of the baseband analog signal to cancel a DC offset analogically, and a share analog adder 133 in the second-order delta-sigma modulation type A/D converter which subtracts a second feedback analog signal for A/D conversion, a second integrator 126 which integrates an analog signal output from the share analog adder 133, a quantizer 127 which quantizes an output of the second integrator 126 to a digital signal, a delay circuit 128 which adjusts the output timing of the quantizer 127, the first D/A converter 122 which converts an output of the delay circuit 128 to an analog signal, and the share D/A converter 134 which converts a digital signal to an analog signal by sharing the function of converting a digital signal to an analog correction signal via a correction section 135 which performs an arithmetic processing on an output of the delay circuit 128 and a digital value of the upper bits of an average value stored in a memory 6 to be described later. The DC offset cancel circuit 2100 further includes an adder 3 which has an output of the quantizer 127 as its one input and subtracts the lower bits of an average value stored in the memory 6 as a DC offset value from the input value and outputs the resultant value, an averaging circuit 45 which acquires an average value of an output signal of an output digital value of the quantizer 127 and outputs the average value to the memory 6 when given an operational instruction, a control section 4 which gives an operational instruction to the averaging circuit 45 in response to a control signal Sc, and the memory 6 which stores an average value computed by the averaging circuit 45.

Figure 22:
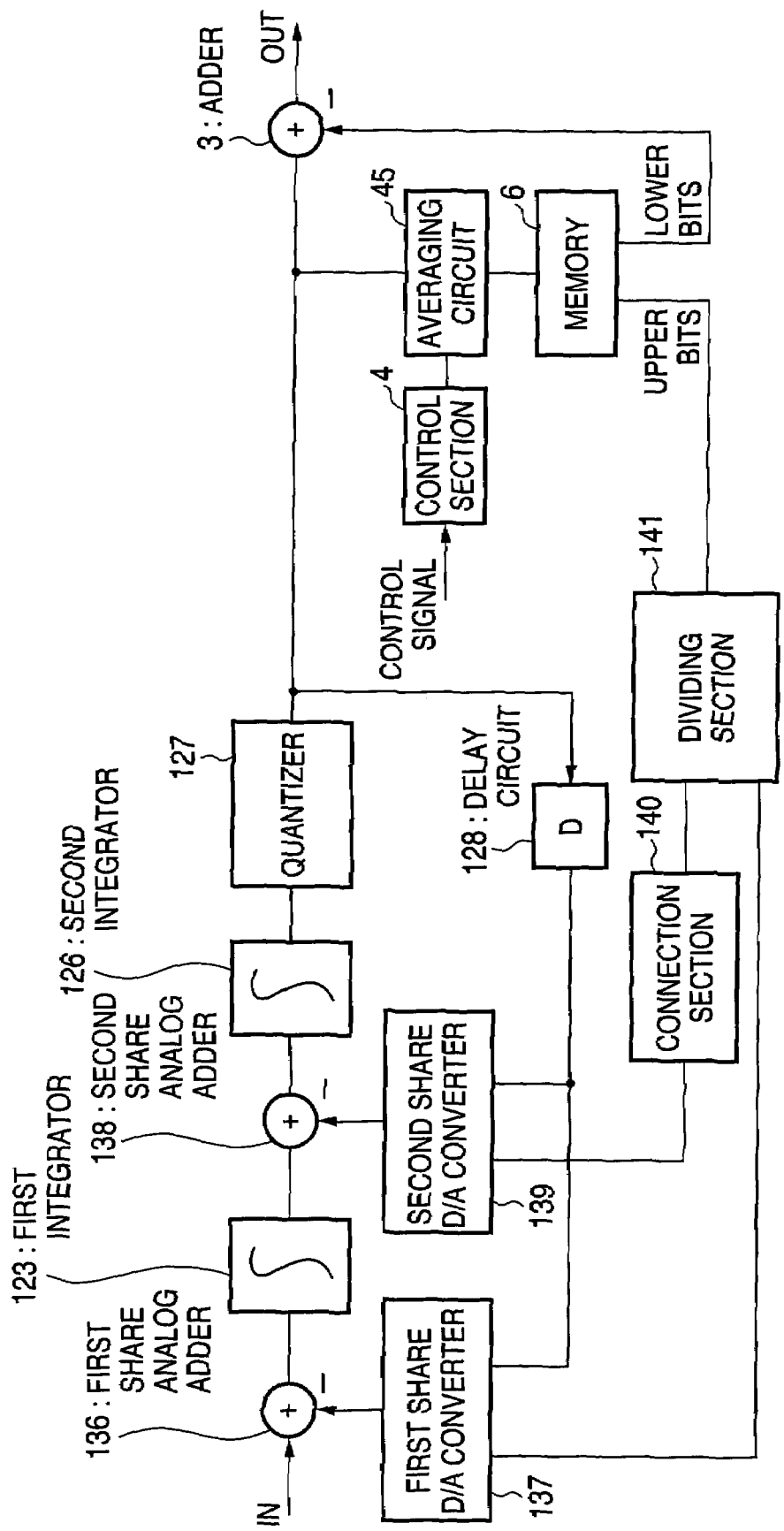
FIG. 22 is a block diagram showing the schematic structure of the DC offset cancel circuit according to the second embodiment of the invention to which a second-order delta-sigma modulation type A/D converter is adapted in the fifteenth embodiment of the invention.

FIG. 22 is a block diagram showing the schematic structure of a DC offset cancel circuit according to the fifteenth embodiment of the invention, and shows a third structural example where the second-order delta-sigma modulation type A/D converter shown in FIG. 17 capable of bringing about a noise shaping effect with the secondary characteristic and realizing A/D conversion of higher performance is adapted to the DC offset cancel circuit 400 in FIG. 4 according to the second embodiment of the invention.

A DC offset cancel circuit 2200 in FIG. 22 includes a first share analog adder 136 that shares an analog adder to whose one input a baseband analog signal output from a high-frequency reception section is input and to which another input of an analog signal output from a first share D/A converter 137 is input, and corrects the reference voltage value of the baseband analog signal to cancel a DC offset analogically, in subtracting a first feedback analog signal for A/D conversion in the second-order delta-sigma modulation type A/D converter, a first integrator 123 which integrates an analog signal output from the first share analog adder 136, a second share analog adder 138 that shares an analog adder to whose one input an output from the first integrator 123 is input and to which another input of an analog signal output from a second share D/A converter 139 is input, and corrects the reference voltage value of the baseband analog signal to cancel a DC offset analogically, in subtracting a second feedback analog signal for A/D conversion in the second-order delta-sigma modulation type A/D converter, a second integrator 126 which integrates an analog signal output from the second share analog adder 138, a quantizer 127 which quantizes an output of the second integrator 126 to a digital signal, a delay circuit 128 which adjusts the output timing of the quantizer 127, a dividing section 141 which divides the upper bits of an average value stored in a memory 6 to be described later to those for the first share D/A converter 137 and those for the second share D/A converter 139, the first share D/A converter 137 which converts a digital signal to an analog signal by sharing a digital value of the upper bits of an average value stored in a memory for the first share D/A converter 137 and an output of the delay circuit 128, and the second share D/A converter 139 which converts a digital signal to an analog signal by sharing the function of converting a digital signal to an analog correction signal via a correction section 140 which performs an arithmetic processing on a digital value of the upper bits of an average value stored in the memory for the second share D/A converter 139 divided by the dividing section 141. The DC offset cancel circuit 2200 further includes an adder 3 which has an output of the quantizer 127 as its one input and subtracts the lower bits of an average value stored in the memory 6 as a DC offset value from the input value and outputs the resultant value, an averaging circuit 45 which acquires an average value of an output signal of an output digital value of the quantizer 127 and outputs the average value to the memory 6 when given an operational instruction, a control section 4 which gives an operational instruction to the averaging circuit 45 in response to a control signal Sc, and the memory 6 which stores an average value computed by the averaging circuit 45.

Figure 23:
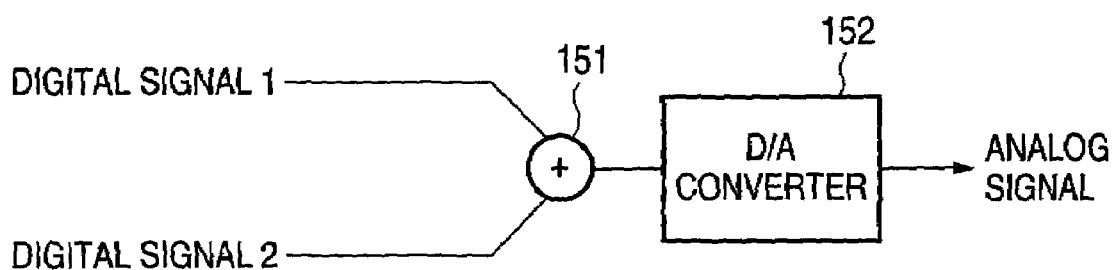
FIG. 23 (a)(b) is a block diagram showing the schematic structure of a share D/A converter.
Figure 23:
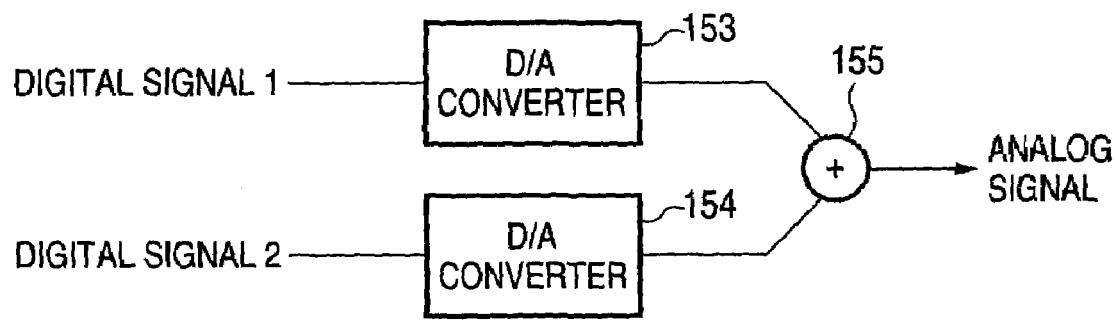

FIG. 23 shows one structural example of the share D/A converters 130, 132, 134, 137 and 139 in FIGS. 18 to 22. FIG. 23(a) shows an example where two digital signals are digitally added at the input section of a D/A converter 152 and are shared. FIG. 23(b) shows an example where two digital signals are subjected to D/A conversion and are analogically added at the output section to be shared. According to the invention, either case is applicable. It is a matter of course that in the case of FIG. 23(b), two digital signals can be shared and added at a time by an analog adder 155 to which outputs of two D/A converters 153 and 154 are output.

Figure 2A:
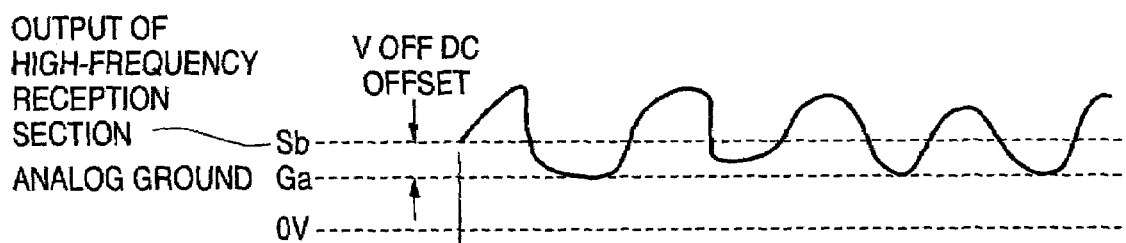
FIG. 2(A) (B)(C) is an operation timing chart of the DC offset cancel circuit.
Figure 2B:
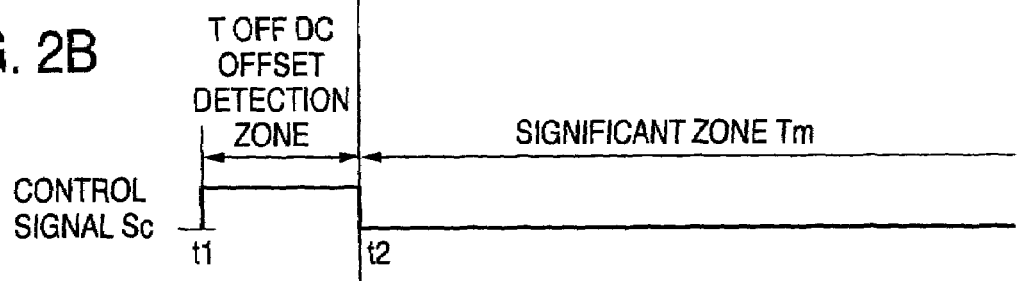
Figure 2C:
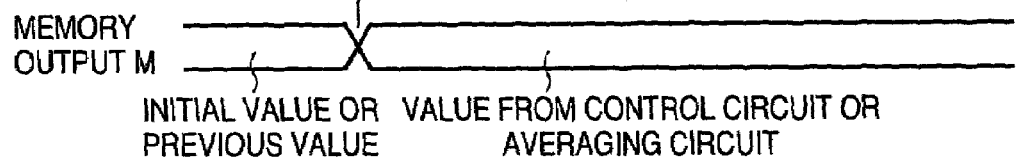

Next, the operations of the DC offset cancel circuit 100 shown in FIG. 1 and the DC offset cancel circuit 400 shown in FIG. 4 will be described. FIG. 2 is an operation timing chart of the DC offset cancel circuits 100 and the DC offset cancel circuit 400 according to the embodiment. FIG. 2(A) shows a baseband analog signal Sb which is an output signal from the high-frequency reception section, and an analog ground Ga. FIG. 2(B) shows a control signal Sc, and FIG. 2(C) shows a memory output signal M.

As shown in FIG. 2(A), the baseband analog signal Sb output from the high-frequency reception section is controlled in such a way as to have a DC level in a DC offset detection zone Toff, and has a DC offset Voff with respect to the analog ground Ga.

As shown in FIG. 2(B), the control signal Sc is output at an H level in the DC offset detection zone Toff (times t1 to t2), and the control section 4 instructs the initiation of an operation to the control circuit 5 or the averaging circuit 45 in the DC offset detection zone Toff in response to the control signal Sc. The control circuit 5 in the DC offset cancel circuit 100 extracts one sample value from a digital signal of a DC level of the baseband analog signal Sb that undergoes A/D conversion in the DC offset detection zone Toff, or the averaging circuit 45 in the DC offset cancel circuit 400 acquires an average value of a digital signal of a DC level of the baseband analog signal Sb that undergoes A/D conversion in the DC offset detection zone Toff, and the sample value or the average value is stored in the memory 6 at last timing t2 of the DC offset detection zone Toff.

In the next instance, the stored sample value or average value is divided into upper bits and lower bits at the output of the memory 6, the upper bits are input to the D/A converter 7 while the lower bits are input to the adder 3 at the subsequent stage of the A/D converter 2.

The output of the D/A converter 7 is supplied to another input of the analog adder 1, and works as to correct the reference voltage of the baseband analog signal Sb to analogically cancel a DC offset. Simultaneously, the adder 3 to which the lower bits of the sample value or the average value are input works to digitally cancel a DC offset. As a result, a digital signal with a DC offset canceled is output in a significant zone Tm shown in FIG. 2(B).

The embodiments of the invention will be described using specific numerals. Let us consider a case where, for example, the maximum amplitude of the baseband analog signal Sb output from the high-frequency reception section is 1.26 Vpp and a DC offset of ±0.6V at a maximum is superimposed as a DC offset. To make the description simpler, the analog ground Ga is 0V, the resolution of the A/D converter 2 is 6 bits, and the cancellation accuracy of the DC offset demanded is also 6 bits. Of the output M of the memory 6 to be divided, the upper three bits are input to the D/A converter 7, and the lower three bits are input to the adder 3 at the subsequent stage of the A/D converter 2.

In this case, as the resolution of the A/D converter 2 is 6 bits, the digital values of a 2's complement code become ±31 and 0 or 63 scales, so that the A/D converter 2 can divide the maximum amplitude of 1.26V of the baseband analog signal Sb to steps of 0.02V.

When a DC offset Voff of +0.3V is superimposed, the digital value of the A/D converter $2w$ which is converted in the DC offset detection zone Toff indicates "+15" in a decimal notation and "001111" in a binary notation. The sample value extracted by the control circuit 5 or the conversion result that is averaged by the averaging circuit 45 is stored in the memory 6 at the last timing t2 in the DC offset detection zone Toff, and is divided to the upper three bits of "001 (+1)" and the lower three bits of "111 (+7)".

FIG. 3 is a conversion correlation table of the D/A converter 7 in the embodiment. When the upper three bits of "001 (+1)" are input to the D/A converter 7, the D/A converter 7 converts the upper bits to an analog signal of −0.16V. In the analog adder 1, a DC offset of +0.3V is corrected by the output of −0.16V of the D/A converter, and +0.14V is input to the A/D converter 2. The output digital code of +0.14 of the A/D converter 2 is "+7" in a decimal notation. The digital code of "+7" eventually becomes "0" as the lower bits of "111 (+7)" from the memory 6 are input to the adder and subtracted. The sequence of operations cancel the DC offset.

Although the resolution of the A/D converter 2 is set to 6 bits to make the description simpler, even when a high-resolution A/D converter of, for example, 12 bits is used and a DC offset to be superimposed is as large as, for example, ±0.6, a DC offset cancel circuit can be constructed easily with the D/A converter 7 with a low resolution of, for example, 3 bits while guaranteeing a high cancel accuracy. This can suppress an increase in circuit scale and an increase in power consumption.

According to the DC offset cancel method of the embodiment, as the reference voltage of the analog baseband signal is corrected analogically by using an analog correction signal corresponding to the upper bits of a sample value or an average value, it is possible to correct the DC offset of the signal level input to the A/D converter to thereby prevent the minimum value and the maximum value from increasing and reduce the required specification of the input dynamic range.

As the lower bits of a sample value or an average value are subtracted digitally to cancel a DC offset, high-accuracy arithmetic processings are possible, so that the required specification of the resolution of the D/A converter assigned to the upper bits can be reduced.

With regard to the DC offset cancel circuits according to the eleventh to fifteenth aspects of the invention, in the case where the A/D converter 2 in the DC offset cancel circuits according to the first to tenth aspects of the invention is an A/D converter that includes an analog adder and a D/A converter, which outputs a feedback analog signal for A/D conversion to the analog adder, as typified by a delta-sigma modulation type A/D converter, the analog adder shares a function of subtracting, from an analog signal input to one end, an analog correction signal input from the other end, similar to the function of the analog adder in the DC offset cancel circuits according to the first to tenth aspects of the invention, and a function of adding or subtracting the feedback analog signal for A/D conversion, and the D/A converter has a function of adding, at the input section of the D/A converter or at the output section of the D/A converter, a function of performing D/A conversion of the upper bits of a value stored in the memory 6 which is a sample value extracted by the control circuit 5 or an average value computed by the averaging circuit 45 in the DC offset cancel circuits according to the first to tenth aspects of the invention, a function of performing D/A conversion of the feedback analog signal for normal A/D conversion. This structure eliminates the need for the analog adder at the preceding stage of the A/D converter, making it possible to reduce the required specification of the input dynamic range of an analog circuit, such as an integrator at the subsequent stage of the analog adder in the A/D converter.

As the DC offset cancel circuit according to the present invention supplies the upper bits of a value stored in the memory storing a value computed in the control circuit or the averaging circuit to the analog adder at the input section using the D/A converter, and corrects the reference voltage of the analog baseband signal analogically, it has an effect of being able to correct the DC offset of the signal level input to the A/D converter at the subsequent stage of the analog adder to thereby prevent the minimum value and the maximum value from increasing and reduce the required specification of the input dynamic range. In addition, the invention has an effect such that in the case where the A/D converter is an A/D converter that includes an analog adder and a D/A converter, which outputs a feedback analog signal for A/D conversion to the analog adder, as typified by a delta-sigma modulation type A/D converter, by sharing the internal analog adder and D/A converter as a circuit which corrects a DC offset, the analog adder at the preceding stage of the A/D converter should not necessarily be provided, making it possible to reduce the required specification of the dynamic range of an analog circuit, such as an integrator at the subsequent stage of the analog adder in the A/D converter. When used in a demodulation circuit, etc., in a radio communication system such as a portable telephone, the DC offset cancel circuit is effective as a circuit for eliminating a DC component to be superimposed on a digital signal when a baseband analog signal output from the high-frequency reception section in a receiver is converted to a digital signal which is in turn input to the demodulation section.

What is claimed is:

1. A DC offset cancel circuit including:
   an analog adder which subtracts, from a baseband analog signal input to one end, an analog correction signal input from the other end;
   an A/D converter which converts an output of the analog adder to a digital value;
   a control circuit which extracts an output digital value of the A/D converter as a sample value;
   a control section which controls an operation timing of the control circuit;
   a memory which stores the sample value;
   a D/A converter which converts upper bits of the sample value to an analog value and outputs the analog value as the analog correction signal to the analog adder; and
   an adder which subtracts, from an output of the A/D converter input to one end, lower bits of the sample value input from the other end.

2. The DC offset cancel circuit according to claim 1, wherein the control circuit is an averaging circuit which acquires an average value of an output digital value of the A/D converter.

3. The DC offset cancel circuit according to claim 1 or 2, wherein the control section sets a DC offset detection zone of the baseband analog signal as the operation timing.

4. The DC offset cancel circuit according to claim 1 or 2, including a determination section which performs timing control of the control circuit in a noise zone determined from an output signal of the adder.

5. The DC offset cancel circuit according to claim 1 or 2, including a determination section which performs timing control of the control circuit in a noise zone determined from an output signal of the A/D converter.

6. The DC offset cancel circuit according to claim 1 or 2, including a determination section which performs timing control of the control circuit in a noise zone determined from an output signal of the analog adder.

7. The DC offset cancel circuit according to claim 1 or 2, including a determination section which performs timing control of the control circuit in a noise zone determined from the baseband analog signal.

8. A DC offset cancel circuit including:
   an A/D converter having an analog adder and a D/A converter for feeding back an analog signal for digital conversion to the analog adder, in which the analog adder subtracts, from a baseband analog signal input to one end, an analog correction signal input from the other end;
   a control circuit which extracts an output digital value of the A/D converter as a sample value;
   a control section which controls an operation timing of the control circuit;
   a memory which stores the sample value;

a D/A converter which converts an output digital value of the A/D converter input to one end and upper bits of the sample value input to the other end to an analog value and outputs the analog value as the analog correction signal to the analog adder; and an adder which subtracts, from an output digital value of the A/D converter input to one end, lower bits of the sample value input from the other end.

9. The DC offset cancel circuit according to claim 8, wherein the A/D converter is a high-order converter.

10. The DC offset cancel circuit according to claim 9, including a correction section which performs an arithmetic processing on the upper bits of the sample value.

11. The DC offset cancel circuit according to any one of claims 8 to 10, wherein the D/A converter which outputs the correction signal to the analog adder has a shared structure.

12. The DC offset cancel circuit according to claim 8, wherein the A/D converter has a digital filter.

13. The DC offset cancel circuit according to claim 8, wherein the control circuit is an averaging circuit which acquires an average value of an output digital value of the A/D converter.

14. The DC offset cancel circuit according to claim 8, wherein the control section sets a DC offset detection zone of the baseband analog signal as the operation timing.

15. The DC offset cancel circuit according to claim 8, including a determination section which performs timing control of the control circuit in a noise zone determined from an output signal of the adder.

16. The DC offset cancel circuit according to claim 8, including a determination section which performs timing control of the control circuit in a noise zone determined from an output signal of the A/D converter.

17. The DC offset cancel circuit according to claim 8, including a determination section which performs timing control of the control circuit in a noise zone determined from an output signal of the analog adder.

18. The DC offset cancel circuit according to claims 8, including a determination section which performs timing control of the control circuit in a noise zone determined from the baseband analog signal.

19. A DC offset cancel circuit including:
an analog adder which subtracts, from a baseband analog signal input to one end, an analog correction signal input from the other end;
an integrator which integrates an output of the analog adder;
a quantizer which quantizes an output of the integrator;
a control circuit which extracts an output digital value of the quantizer as a sample value;
a control section which controls an operation timing of the control circuit;
a memory which stores the sample value;
a 2-input D/A converter which converts an output digital value of the quantizer input to one end and upper bits of the sample value input to the other end to an analog value and outputs the analog value as the analog correction signal to the analog adder; and
an adder which subtracts, from an output digital value of the quantizer input to one end, lower bits of the sample value input from the other end.

20. A DC offset cancel circuit including:
a first analog adder which subtracts, from a baseband analog signal input to one end, an analog correction signal input from the other end;
a first integrator which integrates an output of the first analog adder;

a second analog adder which subtracts, from an output of the first integrator input to one end, an analog signal input from the other end;
a second integrator which integrates an output of the second analog adder;
a quantizer which quantizes an output of the second integrator;
a control circuit which extracts an output digital value of the quantizer as a sample value;
a control section which controls an operation timing of the control circuit;
a memory which stores the sample value;
a 2-input D/A converter which converts an output digital value of the quantizer input to one end and upper bits of the sample value input to the other end to an analog value and outputs the analog value as the analog correction signal to the first analog adder;
a D/A converter which converts an output digital value of the quantizer to an analog value and outputs the analog value to the second analog adder; and
an adder which subtracts, from an output digital value of the quantizer input to one end, lower bits of the sample value input from the other end.

21. A DC offset cancel circuit including:
a first analog adder which subtracts, from a baseband analog signal input to one end, an analog signal input from the other end;
a first integrator which integrates an output of the first analog adder;
a second analog adder which subtracts an analog correction signal from an output of the first integrator input to one end;
a second integrator which integrates an output of the second analog adder;
a quantizer which quantizes an output of the second integrator;
a control circuit which extracts an output digital value of the quantizer as a sample value;
a control section which controls an operation timing of the control circuit;
a memory which stores the sample value;
a correction section which performs an arithmetic processing on upper bits of the sample value;
a D/A converter which converts an output digital value of the quantizer to an analog value and outputs the analog value to the first analog adder;
a 2-input D/A converter which converts an output digital value of the quantizer input to one end and an output digital value of the correction section input to the other end to an analog value and outputs the analog value as the analog correction signal to the second analog adder; and
an adder which subtracts, from an output digital value of the quantizer input to one end, lower bits of the sample value input from the other end.

22. A DC offset cancel circuit including:
a first analog adder which subtracts, from a baseband analog signal input to one end, a first analog correction signal input from the other end;
a first integrator which integrates an output of the first analog adder;
a second analog adder which subtracts a second analog correction signal from an output of the first integrator;
a second integrator which integrates an output of the second analog adder;
a quantizer which quantizes an output of the second integrator;

a control circuit which extracts an output digital value of the quantizer as a sample value;

a control section which controls an operation timing of the control circuit;

a memory which stores the sample value;

a dividing section which divides upper bits of the sample value to first and second upper bits;

a correction section which performs an arithmetic processing on the second upper bits output from the dividing section;

a first 2-input D/A converter which converts an output digital value of the quantizer input to one end and the first upper bits output from the dividing section and input to the other end to an analog value and outputs the analog value as the first analog correction signal to the first analog adder;

a second 2-input D/A converter which converts an output digital value of the quantizer input to one end and an output digital value of the correction section input to the other end to an analog value and outputs the analog value as the second analog correction signal to the second analog adder; and an adder which subtracts, from an output of the quantizer input to one end, lower bits of the sample value input from the other end.

23. The DC offset cancel circuit according to any one of claims 19 to 22, wherein the 2-input D/A converter has an adder which adds an output of the quantizer to a digital value corresponding to upper bits of the memory, and a D/A converter which converts an output of the adder to an analog signal.

24. The DC offset cancel circuit according to any one of claims 19 to 22, wherein the 2-input D/A converter has a D/A converter which converts an output digital value of the quantizer to an analog value, a D/A converter which converts a digital value corresponding to upper bits of the memory to an analog value, and an adder which adds outputs of the D/A converters.

25. The DC offset cancel circuit according to any one of claims 19 to 22, including a digital filter provided between the quantizer and the adder.

26. The DC offset cancel circuit according to any one of claims 19 to 22, wherein the control circuit is an averaging circuit which acquires an average value of output digital values of the quantizer.

27. The DC offset cancel circuit according to any one of claims 19 to 22, wherein the control section sets a DC offset detection zone of the baseband analog signal as the operation timing.

28. The DC offset cancel circuit according to any one of claims 19 to 22, including a determination section which performs timing control of the control circuit in a noise zone determined from an output signal of the adder.

29. The DC offset cancel circuit according to any one of claims 19 to 22, including a determination section which performs timing control of the control circuit in a noise zone determined from an output signal of the quantizer.

30. The DC offset cancel circuit according to any one of claims 19 to 22, including a determination section which performs timing control of the control circuit in a noise zone determined from an output signal of the analog adder.

31. The DC offset cancel circuit according to any one of claims 19 to 22, including a determination section which performs timing control of the control circuit in a noise zone determined from the baseband analog signal.

* * * * *